United States Patent
Lee et al.

(10) Patent No.: US 10,361,620 B2
(45) Date of Patent: Jul. 23, 2019

(54) VOLTAGE CONVERTER AND OPERATING METHOD OF VOLTAGE CONVERTER

(71) Applicant: Samsung Electronics Co., Ltd., Suwon-si, Gyeonggi-do (KR)

(72) Inventors: Kwang Chan Lee, Hwaseong-si (KR); Sungwoo Lee, Suwon-si (KR); Jungwook Heo, Yongin-si (KR); Hyoungseok Oh, Seoul (KR); Jiheon Kang, Hwaseong-si (KR); Hocheol Chung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/967,687

(22) Filed: May 1, 2018

(65) Prior Publication Data

US 2019/0081549 A1    Mar. 14, 2019

(30) Foreign Application Priority Data

Sep. 8, 2017    (KR) .................. 10-2017-0115348

(51) Int. Cl.
*H02M 3/155* (2006.01)
*H02M 1/088* (2006.01)

(52) U.S. Cl.
CPC .......... *H02M 1/088* (2013.01); *H02M 3/155* (2013.01)

(58) Field of Classification Search
CPC .............................. H02M 1/088; H02M 3/155
See application file for complete search history.

(56) References Cited

U.S. PATENT DOCUMENTS

| | | | |
|---|---|---|---|
| 6,812,782 B2 | 11/2004 | Grant | |
| 7,265,601 B2 | 9/2007 | Ahmad | |
| 7,518,352 B2 | 4/2009 | De Lima Filho et al. | |
| 8,502,511 B1 | 8/2013 | Kung | |
| 8,779,733 B2 | 7/2014 | Chen | |
| 8,970,185 B1 | 3/2015 | Sutardja et al. | |
| 9,312,773 B2* | 4/2016 | Li ..................... | H02M 3/1588 |
| 9,484,758 B2 | 11/2016 | Chen et al. | |
| 9,577,520 B2 | 2/2017 | Xiu et al. | |
| 9,590,608 B2 | 3/2017 | Xu | |
| 9,625,932 B2 | 4/2017 | Qu et al. | |
| 2013/0099846 A1 | 4/2013 | Sohma | |
| 2015/0042298 A1 | 2/2015 | Kung et al. | |
| 2017/0117803 A1 | 4/2017 | Matsuki et al. | |
| 2017/0133929 A1 | 5/2017 | Matsuki et al. | |

* cited by examiner

*Primary Examiner* — Adolf D Berhane
*Assistant Examiner* — Afework S Demisse
(74) *Attorney, Agent, or Firm* — Harness, Dickey & Pierce, P.L.C.

(57) ABSTRACT

The voltage converter including an inductor connected between an output node and a switch node, a capacitor connected between the output node and a ground node, first transistor connected between the switch node and the ground node, a second transistor connected between the switch node and an input node, a boost capacitor connected between the switch node and a boost node, a first driver configured to drive a gate voltage of the first transistor based on a ground voltage of the ground node and a power supply voltage of a power node, a second driver configured to drive a gate voltage of the second transistor based on a switch voltage of the switch node and a boost voltage of the boost node and, and a regulator configured to control the boost voltage depending on a status of the voltage converter may be provided.

17 Claims, 18 Drawing Sheets

VOLTAGE CONVERTER AND OPERATING METHOD OF VOLTAGE CONVERTER

CROSS-REFERENCE TO RELATED APPLICATIONS

This application claims priority under 35 U.S.C. § 119 to Korean Patent Application No. 10-2017-0115348, filed on Sep. 8, 2017, in the Korean Intellectual Property Office, the entire contents of which are hereby incorporated by reference.

BACKGROUND

Example embodiments of the inventive concepts disclosed herein relate to semiconductor circuits, and more particularly, to voltage converters and/or operating methods thereof.

A voltage converter is configured to convert a level of an input voltage and output the converted input voltage as an output voltage. The voltage converter is used in various electronic devices. Generally, a supply voltage provided in a home, a company, or a public facility has a level of 110 V or 220 V.

However, electronic devices usually use internal voltages having a level lower than 110 V or 220 V. To convert the supply voltage to internal voltages, various voltage converters are used in an electronic device. Accordingly, there is an increasing demand for highly reliable voltage converters to be used in various electronic devices.

SUMMARY

Some example embodiments of the inventive concepts provide voltage converters with improved reliability and/or an operating methods thereof.

According to an example embodiment, a voltage converter includes an inductor connected between an output node and a switch node, a capacitor connected between the output node and a ground node, first transistor connected between the switch node and the ground node, a second transistor connected between the switch node and an input node, a boost capacitor connected between the switch node and a boost node, a first driver configured to drive a gate voltage of the first transistor based on a ground voltage of the ground node and a power supply voltage of a power node, a second driver configured to drive a gate voltage of the second transistor based on a switch voltage of the switch node and a boost voltage of the boost node and, and a regulator configured to control the boost voltage depending on a status of the voltage converter.

According to an example embodiment, a voltage converter includes an inductor connected between an input node and a switch node, a first capacitor connected between the input node and a ground node, a first transistor connected between the switch node and the ground node, a second transistor connected between the switch node and an output node, a boost capacitor connected between the switch node and a boost node, a second capacitor connected between the output node and the ground node, a first driver that drives a gate voltage of the first transistor, a second driver that drives a gate voltage of the second transistor depending on a boost voltage of the boost node and a switch voltage of the switch node, and a regulator configured to control the boost voltage by selecting one of two or more modes depending on a status of the voltage converter.

According to an example embodiment, an operating method of a voltage converter including first and second switching transistors includes determining a status of the voltage converter, and adjusting a gate voltage to be applied to a gate of at least one switching transistor of the first and second switching transistors depending on the status of the voltage converter.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Below, some example embodiments of the inventive concepts may be described in detail and clearly to such an extent that an ordinary one in the art easily implements the inventive concepts.

Figure 1:
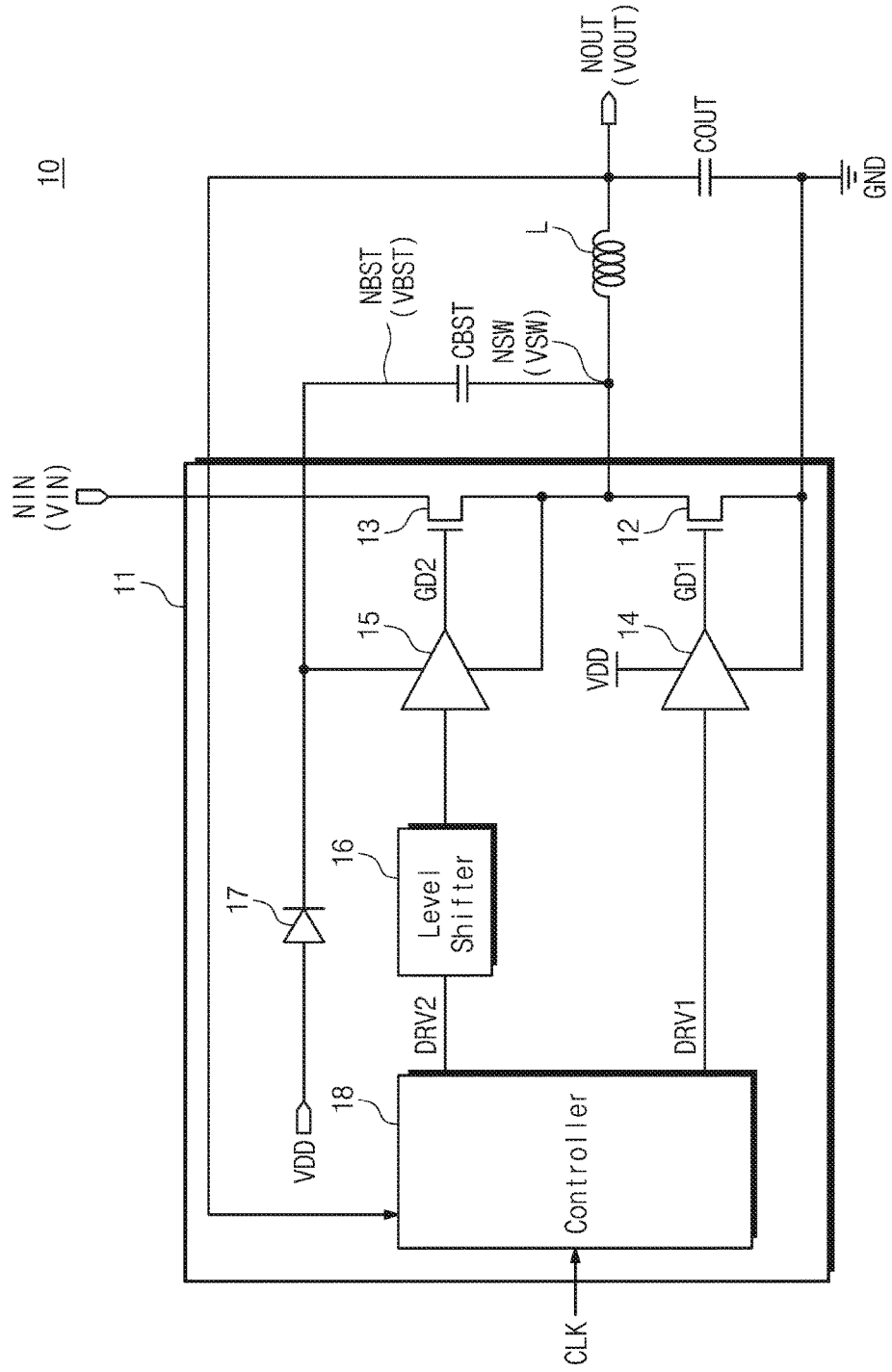
FIG. 1 illustrates a voltage converter according to an example embodiment of the inventive concepts.

FIG. 1 illustrates a voltage converter 10 according to an example embodiment of the inventive concepts. Referring to FIG. 1, the voltage converter 10 includes first and second transistors 12 and 13, first and second gate drivers 14 and 15, a level shifter 16, a diode 17, a controller 18, an output capacitor COUT, an inductor "L", and a boost capacitor CBST.

The voltage converter 10 may convert an input voltage VIN of an input node NIN to an output voltage VOUT of an output node NOUT. For example, the voltage converter 10 may be a buck converter that steps down a level of the input voltage VIN to output the output voltage VOUT.

The first and second transistors 12 and 13 may be connected in series between a ground node GND supplied with a ground voltage and the input node NIN. A node between the first and second transistors 12 and 13 may be a switch node NSW. The inductor "L" is connected between the switch node NSW and the output node NOUT. The output capacitor COUT is connected between the output node NOUT and the ground node GND.

The first gate driver 14 is biased by a power supply voltage VDD and the ground voltage. The first gate driver 14 may output a first gate driving signal GD1 to control a gate of the first transistor 12. The second gate driver 15 is biased by a boost voltage VBST of a boost node NBST and a switch voltage VSW of the switch node NSW. The second gate driver 15 may output a second gate driving signal GD2 to control a gate of the second transistor 13.

The controller 18 may receive a clock signal CLK and the output voltage VOUT. The controller 18 may control the first and second gate drivers 14 and 15 in response to the clock signal CLK and the output voltage VOUT. A first driving signal DRV1 of the controller 18 is transmitted to the first gate driver 14.

A second driving signal DRV2 of the controller 18 is transmitted to the second gate driver 15 through the level shifter 16. The level shifter 16 may convert (e.g., increase) a level of the second driving signal DRV2 to a level defined by the boost voltage VBST and the switch voltage VSW.

The boost capacitor CBST is connected between the boost node NBST and the switch node NSW. The power supply voltage VDD is transmitted to the boost capacitor CBST through the diode 17. When the first transistor 12 is turned on, the boost capacitor CBST may be charged by the power supply voltage VDD. The first and second transistors 12 and 13, the first and second gate drivers 14 and 15, the level shifter 16, the diode 17, and the controller 18 may be implemented with a single chip 11.

When the first transistor 12 is turned off, the boost capacitor CBST may maintain the boost voltage VBST to be higher, by an amount of the charged voltage, than the switch voltage VSW. That is, the boost capacitor CBST may control the boost voltage VBST for biasing the second gate driver 15 to be greater than the switch voltage VSW, so as to output a level that allows the second gate driver 15 to turn on the second transistor 13.

However, some issues may occur in the voltage converter 10 illustrated in FIG. 1. For example, when the voltage converter 10 is powered on, the boost capacitor CBST may not be charged. That is, the boost voltage VBST may be the same as the switch voltage VSW, and the second gate driving signal GD2 of the second gate driver 15 may fail to turn on the second transistor 13. Accordingly, the voltage converter 10 may cause an abnormal operation.

The voltage converter 10 may enter a power saving mode or a sleep mode or may stop voltage conversion under control of an external device. For example, stopping of the voltage conversion is called a "pulse skip". During the pulse skip, a voltage charged in the boost capacitor CBST may be leaked out. Accordingly, the second gate driving signal GD2 may fail to turn on the second transistor 13, thereby causing an abnormal operation of the voltage converter 10.

The first gate driving signal GD1 and the second gate driving signal GD2 of the voltage converter 10 are complementary. When a duty ratio of the second gate driving signal GD2 is close to 100%, the second gate driving signal GD2 has a max duty. If the second gate driving signal GD2 has the max duty, a duty ratio of the first gate driving signal GD1 is close to 0%. That is, when the max duty occurs in the second gate driving signal GD2, the first transistor 12 may not be turned on, and the boost capacitor CBST may not be charged. Accordingly, an abnormal operation that the second gate driving signal GD2 fails to turn on the second transistor 13 may occur in the voltage converter 10.

Figure 2:
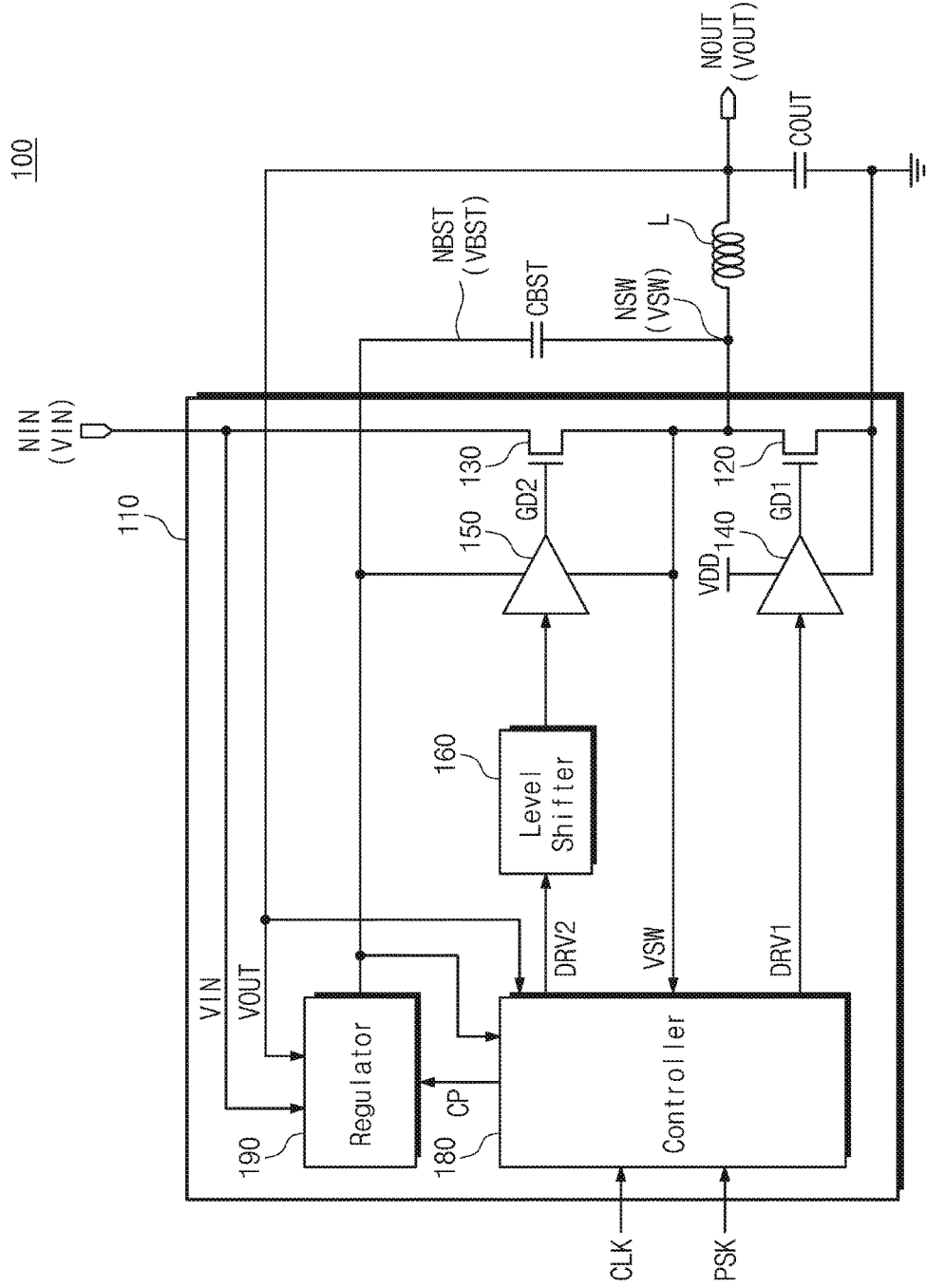
FIG. 2 illustrates a voltage converter according to an example embodiment of the inventive concepts, for solving the above-described issues.

FIG. 2 illustrates a voltage converter 100 according to an example embodiment of the inventive concepts, for solving the above-described issues. Referring to FIG. 2, the voltage converter 100 includes first and second transistors 120 and 130, first and second gate drivers 140 and 150, a level shifter 160, a controller 180, a regulator 190, an inductor "L", an output capacitor COUT, and a boost capacitor CBST.

The voltage converter 100 may convert an input voltage VIN of an input node NIN to an output voltage VOUT of an output node NOUT. For example, the voltage converter 100 may be a buck converter that steps down a level of the input voltage VIN to output an output voltage VOUT.

The first and second transistors 120 and 130 may be connected in series between a ground node GND supplied with a ground voltage and the input node NIN. A node between the first and second transistors 120 and 130 may be a switch node NSW. The inductor "L" is connected between the switch node NSW and the output node NOUT. The output capacitor COUT is connected between the output node NOUT and the ground node GND.

The first and second gate drivers 140 and 150 may control the first and second transistors 120 and 130, respectively, under control of the controller 180. The first gate driver 140 is biased by a power supply voltage VDD and the ground voltage. The first gate driver 140 may output a first gate driving signal GD1 to control a gate (or a gate voltage) of the first transistor 120.

The second gate driver 150 is biased by a boost voltage VBST of a boost node NBST and a switch voltage VSW of the switch node NSW. The second gate driver 150 may output a second gate driving signal GD2 to control a gate (or a gate voltage) of the second transistor 130.

The controller 180 may receive a clock signal CLK, the output voltage VOUT, and the switch voltage VSW. The controller 180 may control the first and second driving signals DRV1 and DRV2 in response to the clock signal CLK, the output voltage VOUT, and/or the switch voltage VSW. For example, the controller 180 may control the first and second driving signals DRV1 and DRV2 such that the output voltage VOUT or the switch voltage VSW is maintained at a target level.

The first driving signal DRV1 of the controller 180 is transmitted to the first gate driver 140. The second driving signal DRV2 of the controller 180 is transmitted to the second gate driver 150 through the level shifter 160. The level shifter 160 may translate (e.g., increase) a level of the second driving signal DRV2 to a level defined by the boost voltage VBST and the switch voltage VSW.

The controller 180 may further receive the boost voltage VBST and a pulse skip signal PSK. The controller 180 may generate control signals CP in response to the clock signal CLK, the boost voltage VBST, the switch voltage VSW, and the pulse skip signal PSK. The control signals CP may be transmitted to the regulator 190 to control an operation of the regulator 190.

The pulse skip signal PSK may be received from an external device (e.g., logic) that controls a pulse skip. If the voltage converter 100 is controlled to operate in a pulse skip mode, the pulse skip signal PSK may be activated (e.g., to a high level). If the voltage converter 100 exits from the pulse skip mode and a given time elapses, the pulse skip signal PSK may be deactivated (for example, a low level).

The regulator 190 may receive the control signals CP from the controller 180. The regulator 190 may further receive the input voltage VIN and the output voltage VOUT. The regulator 190 may control a voltage of the boost node NBST in response to the control signals CP, the input voltage VIN, and the output voltage VOUT. The boost capacitor CBST is connected between the boost node NBST and the switch node NSW.

The regulator 190 may operate in at least three modes under control of the control signals CP. The at least three modes may include a normal mode, an input voltage pumping mode, and an output voltage pumping mode. In the normal mode, the regulator 190 may output the power supply voltage VDD to the boost node NBST.

In the input voltage pumping mode, the regulator 190 may output a voltage pumped from the input voltage VIN to the boost node NBST. In the output voltage pumping mode, the regulator 190 may output a voltage pumped from the output voltage VOUT to the boost node NBST. An operation of the regulator 190 will be described in detail later.

The first and second transistors 120 and 130, the first and second gate drivers 140 and 150, the level shifter 160, the controller 180, and the regulator 190 may be implemented with a single chip 110. However, components included in the single chip 110 are not limited to the first and second transistors 120 and 130, the first and second gate drivers 140 and 150, the level shifter 160, the controller 180, and the regulator 190.

Figure 3:
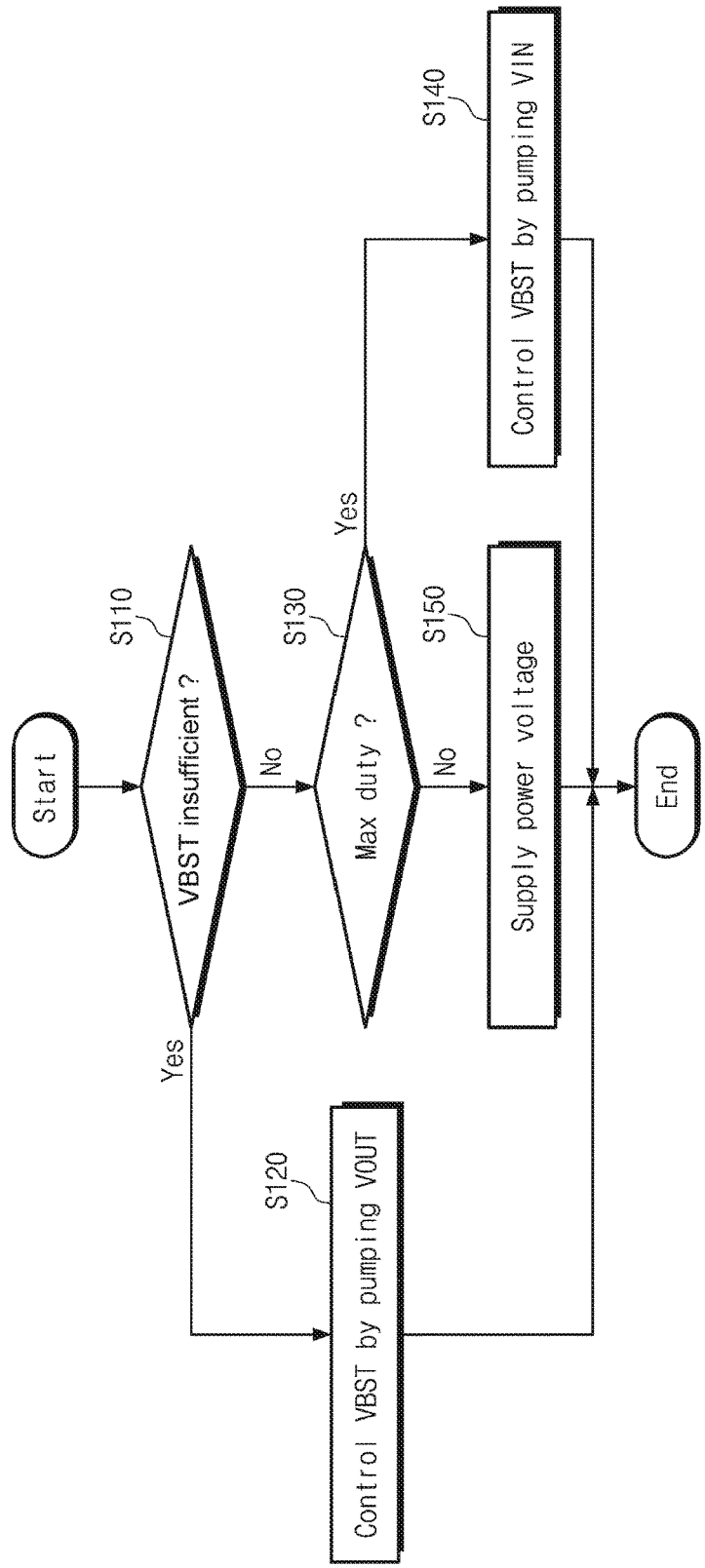
FIG. 3 is a flowchart illustrating an operating method of the voltage converter according to an example embodiment of the inventive concepts.

FIG. 3 is a flowchart illustrating an operating method of the voltage converter 100 according to an example embodiment of the inventive concepts. Referring to FIGS. 2 and 3, in operation S110, the voltage converter 100 determines whether the boost voltage VBST is insufficient. For example, when a difference between the boost voltage VBST and the switch voltage VSW is lower than a reference voltage, the voltage converter 100 may determine that the boost voltage VBST is insufficient. As another example, when the voltage converter 100 exits from the pulse skip mode, the voltage converter 100 may determine that the boost voltage VBST is insufficient.

If the boost voltage VBST is insufficient, the voltage converter 100 enters the output voltage pumping mode. In operation S120, the voltage converter 100 may control the boost voltage VBST by pumping the output voltage VOUT. For example, the regulator 190 may control the boost voltage VBST to be higher in level, by an amount of the power supply voltage VDD, than the output voltage VOUT.

The boost voltage VBST may be insufficient in two cases. For example, when the voltage converter 100 start to be powered, the boost voltage VBST may be insufficient. When the voltage converter 100 exits from the pulse skip mode, the boost voltage VBST may be insufficient.

In the case where the voltage converter 100 is used in a mobile device including a battery, the output voltage VOUT may be a voltage of the battery. When power is not supplied to the voltage converter 100 or when the voltage converter 100 is in the pulse skip mode, the switch voltage VSW may gradually increase to the output voltage VOUT.

If the boost voltage VBST is pumped from the output voltage VOUT when power starts to be supplied to the voltage converter 100 or when the voltage converter 100 exits from the pulse skip mode, then the boost voltage VBST to be greater than the switch voltage VSW may be secured. Accordingly, an abnormal operation in which the second transistor 130 is not turned on may be prevented or mitigated.

For example, if the boost voltage VBST is sufficient, the voltage converter 100 may enter the normal mode. For example, in the normal mode, the voltage converter 100 may control the boost voltage VBST depending on operation S150, which will be described below.

If the boost voltage VBST is sufficient, operation S130 is performed. In operation S130, the voltage converter 100 may determine whether a max duty occurs. For example, when a duty ratio of the second driving signal DRV2 is greater than a threshold value, the max duty may be determined. If the max duty is determined, the voltage converter 100 may enter an input voltage pumping mode. In the input voltage pumping mode, operation S140 is performed.

In operation S140, the voltage converter 100 may control the boost voltage VBST through pumping from the input voltage VIN. If the max duty occurs, in an operation period of the first and second transistors 120 and 130, a time when the second transistor 130 is turned on is longer than a time when the first transistor 120 is turned on.

When the second transistor 130 is turned on, the switch voltage VSW is the same as the input voltage VIN. If the boost voltage VBST is pumped from the input voltage VIN when the second transistor 130 is turned on, then the boost voltage VBST to be greater than the switch voltage VSW may be secured. Accordingly, an abnormal operation in which the second transistor 130 is not turned on may be prevented or mitigated.

For example, if the voltage converter 100 does not have the max duty any longer, the voltage converter 100 may enter the normal mode. For example, in the normal mode, the voltage converter 100 may control the boost voltage VBST depending on operation S150, which will be described below.

If the boost voltage VBST is sufficient and the max duty is not determined, the voltage converter 100 may operate in the normal mode. In the normal mode, operation S150 is performed. In operation S150, the regulator 190 may output the power supply voltage VDD to the boost node NBST. When the first transistor 120 is turned on, the boost capacitor CBST may be charged to the power supply voltage VDD.

When the second transistor 130 is turned on, the boost voltage VBST may be a voltage that corresponds to a sum of the switch voltage VSW (e.g., the input voltage VIN) and a charging voltage of the boost capacitor CBST. Thus, the boost voltage VBST to be greater than the switch voltage VSW may be secured. Accordingly, an abnormal operation in which the second transistor 130 is not turned on may be prevented or mitigated.

Figure 4:
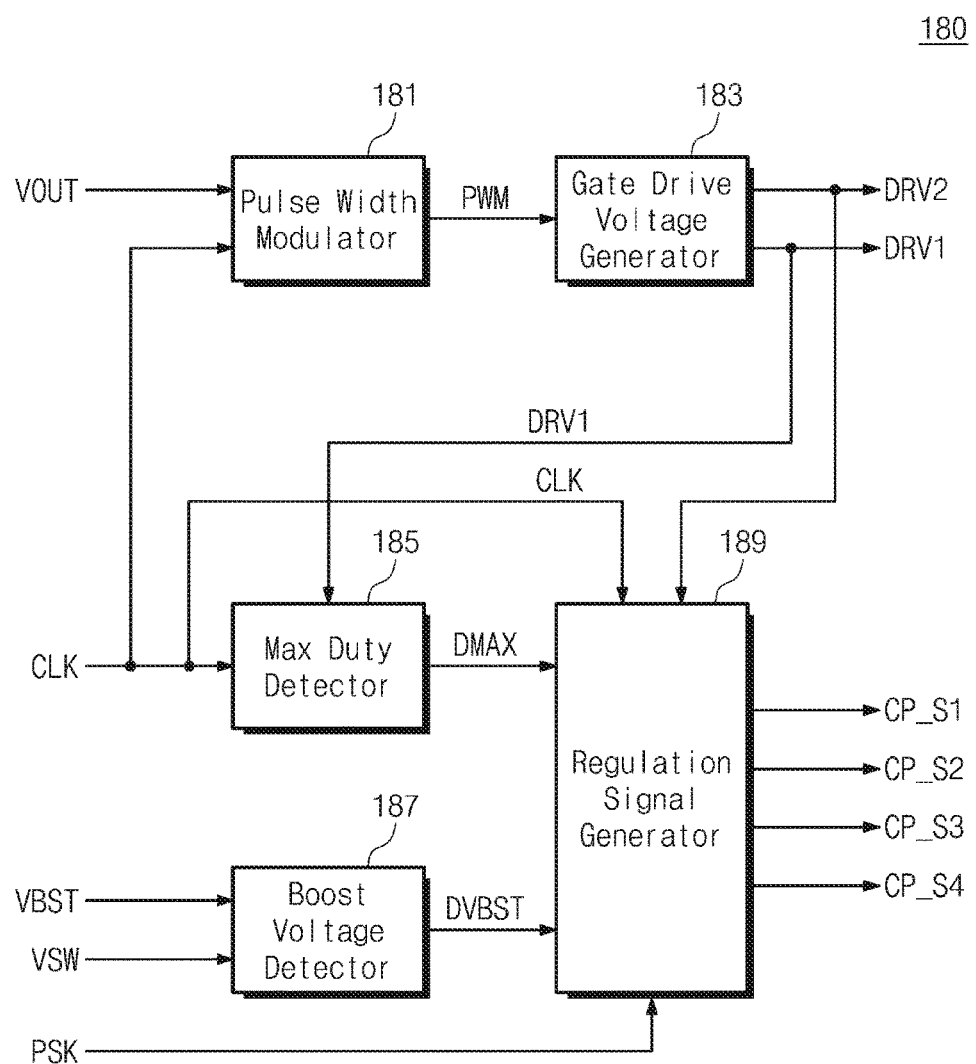
FIG. 4 is a block diagram illustrating a controller according to an example embodiment of the inventive concepts.

FIG. 4 is a block diagram illustrating the controller 180 according to an example embodiment of the inventive concepts. Referring to FIG. 4, the controller 180 includes a pulse width modulator 181, a gate drive voltage generator 183, a max duty detector 185, a boost voltage detector 187, and a regulation signal generator 189.

The pulse width modulator 181 may receive the clock signal CLK and the output voltage VOUT. The pulse width modulator 181 may output a pulse width modulation signal PWM having a pulse width that varies depending on a level of the output voltage VOUT. The pulse width modulation signal PWM is transmitted to the gate drive voltage generator 183.

The gate drive voltage generator 183 may output the first and second driving signals DRV1 and DRV2 in response to the pulse width modulation signal PWM. For example, the gate drive voltage generator 183 may increase (or decrease) a high level interval or a low level interval of the first driving signal DRV1 or the second driving signal DRV2 as a pulse width of the pulse width modulation signal PWM increases.

The first and second driving signals DRV1 and DRV2 may be complementary. If the high level interval of the first driving signal DRV1 increases (or the low level interval thereof decreases), the high level interval of the second driving signal DRV2 may decrease (or the low level interval thereof may increase). Likewise, if the high level interval of the first driving signal DRV1 decreases (or the low level interval thereof increases), the high level interval of the second driving signal DRV2 may increase (or the low level interval thereof may decrease).

The pulse width modulator 181 and the gate drive voltage generator 183 may adjust lengths of high level intervals or low level intervals of the first and second driving signals DRV1 and DRV2 depending on a level of the output voltage VOUT. The output voltage VOUT may be controlled to a target level by adjusting the first and second driving signals DRV1 and DRV2.

The max duty detector 185 receives the clock signal CLK and the first driving signal DRV1. The max duty detector 185 may determine whether the second driving signal DRV2 has the max duty in response to the clock signal CLK and the first driving signal DRV1. The max duty detector 185 may output the determination result as a max duty signal DMAX.

If the second driving signal DRV2 has the max duty, the max duty detector 185 may activate the max duty signal DMAX (or may make the max duty signal DMAX high). If the second driving signal DRV2 does not have the max duty, the max duty detector 185 may deactivate the max duty signal DMAX (or may make the max duty signal DMAX low).

The boost voltage detector 187 may receive the boost voltage VBST and the switch voltage VSW. The boost voltage detector 187 may determine whether a difference between the boost voltage VBST and the switch voltage VSW is less than a reference voltage. If the difference is less than the reference voltage, the boost voltage detector 187 may activate a boost voltage signal DVBST (or may make the boost voltage signal DVBST low). If the difference is not less than the reference voltage, the boost voltage detector 187 may deactivate the boost voltage signal DVBST (or may make the boost voltage signal DVBST high).

The regulation signal generator 189 may receive the clock signal CLK, the max duty signal DMAX, the boost voltage signal DVBST, the pulse skip signal PSK, and the second driving signal DRV2. The regulation signal generator 189 may control first to fourth control signals CP_S1 to CP_S4 in response to the clock signal CLK, the max duty signal DMAX, the boost voltage signal DVBST, the pulse skip signal PSK, and the second driving signal DRV2.

The first to fourth control signals CP_S1 to CP_S4 may be transmitted to the regulator 190. The regulation signal generator 189 may allow the regulator 190 to operate in one of at least three modes including the input voltage pumping mode, the output voltage pumping mode, and the normal mode, by using the first to fourth control signals CP_S1 to CP_S4.

Figure 5:
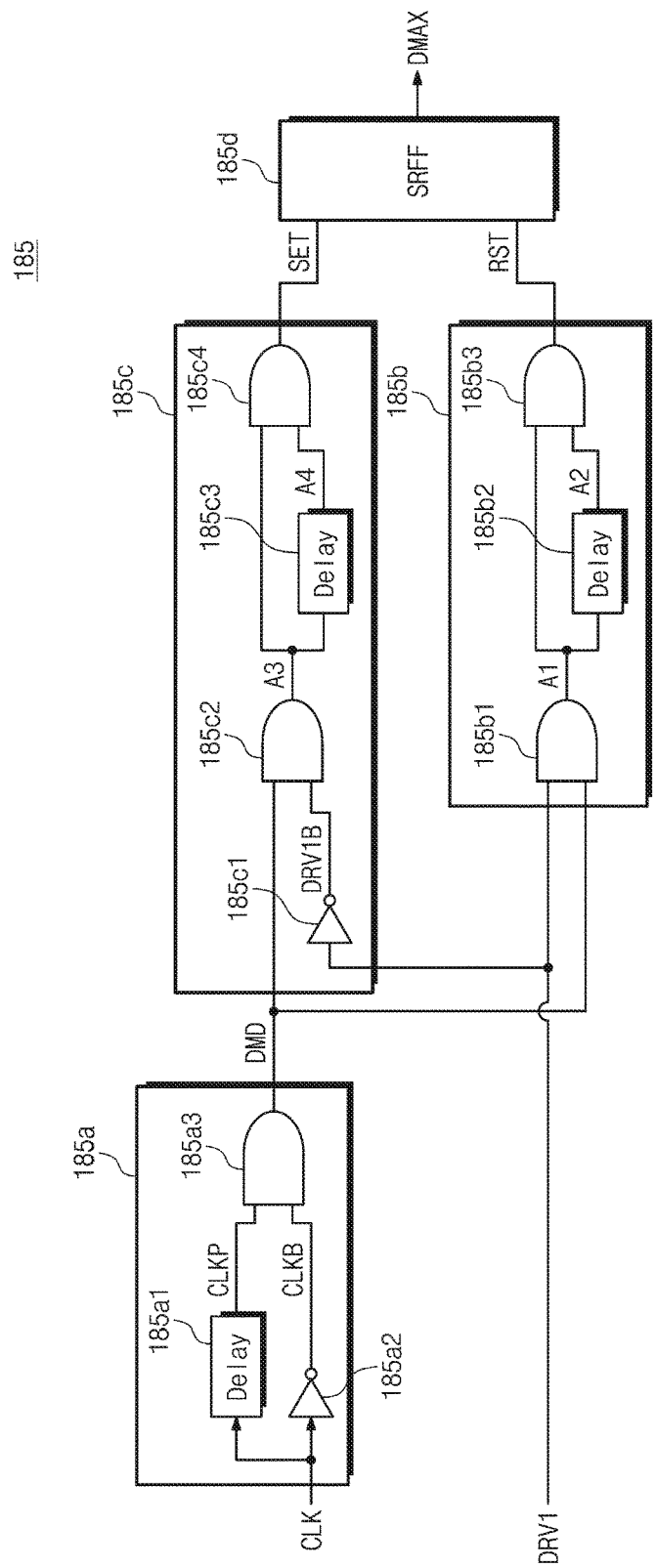
FIG. 5 illustrates an example of a max duty detector according to an example embodiment of the inventive concepts.

FIG. 5 illustrates an example of the max duty detector 185 according to an example embodiment of the inventive concepts. The max duty detector 185 may determine the max duty of the second driving signal DRV2 in response to the clock signal CLK and the first driving signal DRV1. Referring to FIGS. 4 and 5, the max duty detector 185 includes first to third blocks 185a, 185b, and 185c and a flip-flop 185d.

In an example embodiment, the max duty detector 185 may detect the max duty of the second driving signal DRV2 from the first driving signal DRV1 based on a complementary characteristic of the first and second driving signals DRV1 and DRV2. However, the scope and spirit of the inventive concepts are not limited thereto. In some example embodiments, the max duty detector 185 may detect the max duty directly from the second driving signal DRV2.

The first block 185a may periodically output a max duty detection pulse DMD for detecting the max duty of the second driving signal DRV2. The first block 185a may include a first delay 185a1, a first inverter 185a2, and a first AND element 185a3.

The first delay 185a1 may delay the clock signal CLK to output a delayed clock signal CLKP. The first inverter 185a2 may invert the clock signal CLK to output an inverted clock signal CLKB. The first AND element 185a3 may perform an AND operation on the delayed clock signal CLKP and the inverted clock signal CLKB to output the max duty detection pulse DMD.

The second block 185b may output a reset signal RST representing that the second driving signal DRV2 does not have the max duty. The second block 185b may include a second AND element 185b1, a second delay 185b2, and a third AND element 185b3. The second AND element 185b1 may output the result of performing an AND operation on the max duty detection pulse DMD and the first driving signal DRV1 as a first internal signal A1.

The second delay 185b2 may delay the first internal signal A1 to output a second internal signal A2. The third AND element 185b3 may output the result of performing an AND operation on the first and second internal signals A1 and A2 as the reset signal RST. The reset signal RST may be transmitted to a reset input of the flip-flop 185d.

In an example embodiment, the second delay 185b2 and the third AND element 185b3 may prevent or mitigate the reset signal RST from fluctuating when a level of the max duty detection pulse DMD or the first driving signal DRV1 is converted. In an anti-fluctuation system, the output of the second AND element 185b1 may be used as the reset signal RST.

The third block 185c may output a set signal SET representing that the second driving signal DRV2 has the max duty. The set signal SET may be transmitted to a set input of the flip-flop 185d. The third block 185c may include a second inverter 185c1, a fourth AND element 185c2, a third delay 185c3, and a fifth AND element 185c4.

The second inverter 185c1 may invert the first driving signal DRV1 to output an inverted first driving signal DRV1B. The fourth AND element 185c2 may output the result of performing an AND operation on the max duty detection pulse DMD and the inverted first driving signal DRV1B as a third internal signal A3.

The third delay 185c3 may delay the third internal signal A3 to output a fourth internal signal A4. The fifth AND element 185c4 may output the result of performing an AND operation on the third and fourth internal signals A3 and A4 as the set signal SET. The output of the flip-flop 185d may be set in response to the set signal SET and may be reset in response to the reset signal RST. The output of the flip-flop 185d may be the max duty signal DMAX. The flip-flop 185d may include a set-reset flip-flop (SRFF).

In an example embodiment, the third delay 185c3 and the fifth AND element 185c4 may prevent or mitigate the set signal SET from fluctuating when a level of the max duty detection pulse DMD or the first driving signal DRV1 is converted. In an anti-fluctuation system, the output of the fourth AND element 185c2 may be used as the set signal SET.

Figure 6:
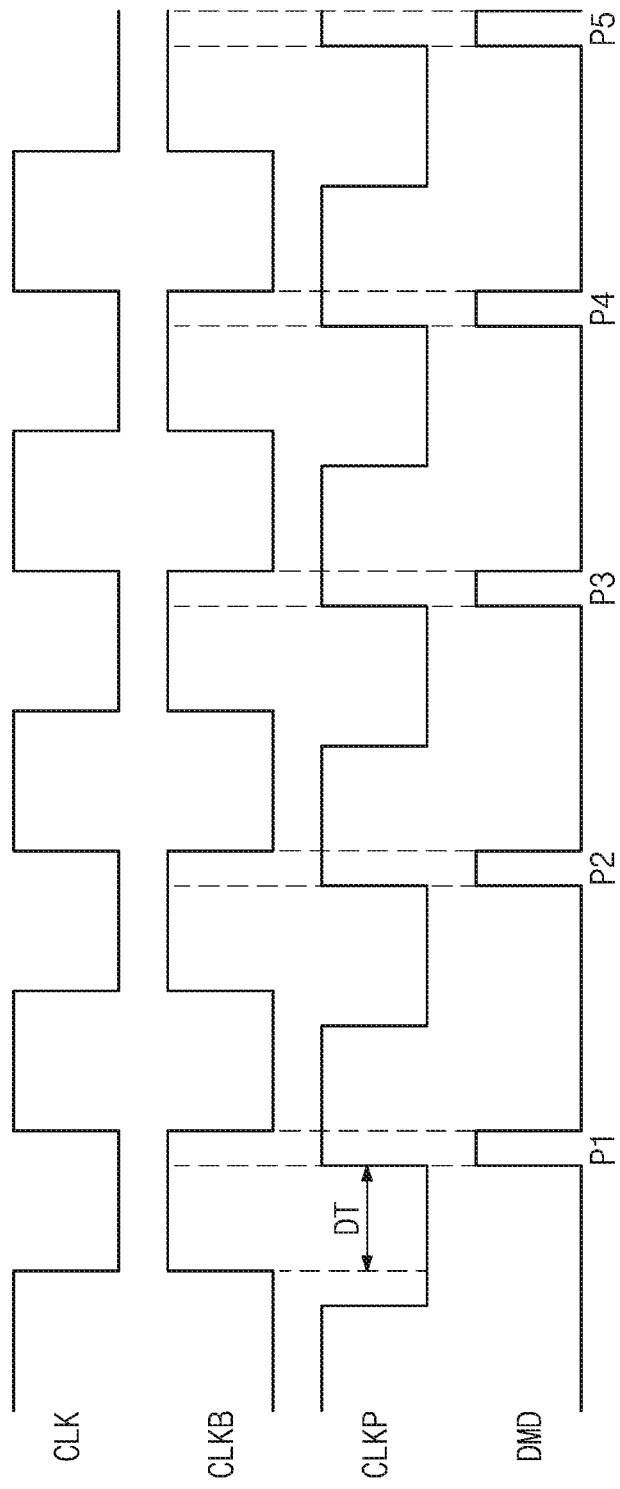
FIG. 6 illustrates an example in which a max duty detection signal is generated from a clock signal, an inverted clock signal, and a delayed clock signal.

FIG. 6 illustrates an example in which the max duty detection signal DMD is generated from the clock signal CLK, the inverted clock signal CLKB, and the delayed clock signal CLKP. Referring to FIGS. 2, 5, and 6, the inverted clock signal CLKB may have an inverted waveform of the clock signal CLK. The delayed clock signal CLKP may have a waveform of the inverted clock signal CLKB delayed as much as a delay time DT.

The max duty detection pulse DMD may be generated through a logical AND of the inverted clock signal CLKB and the delayed clock signal CLKP. Accordingly, the max duty detection pulse DMD has high levels in intervals in which the inverted clock signal CLKB and the delayed clock signal CLKP all have a high level.

The max duty detection pulse DMD has low levels in intervals in which at least one of the inverted clock signal CLKB and the delayed clock signal CLKP has a low level. The max duty detection pulse DMD is illustrated in FIG. 6 as first to fifth pulses P1 to P5 having a high level periodically. In an example embodiment, a delay amount of the first delay 185a1 may be adjusted to set a pulse width of the max duty detection pulse DMD to a desired value.

Figure 7:
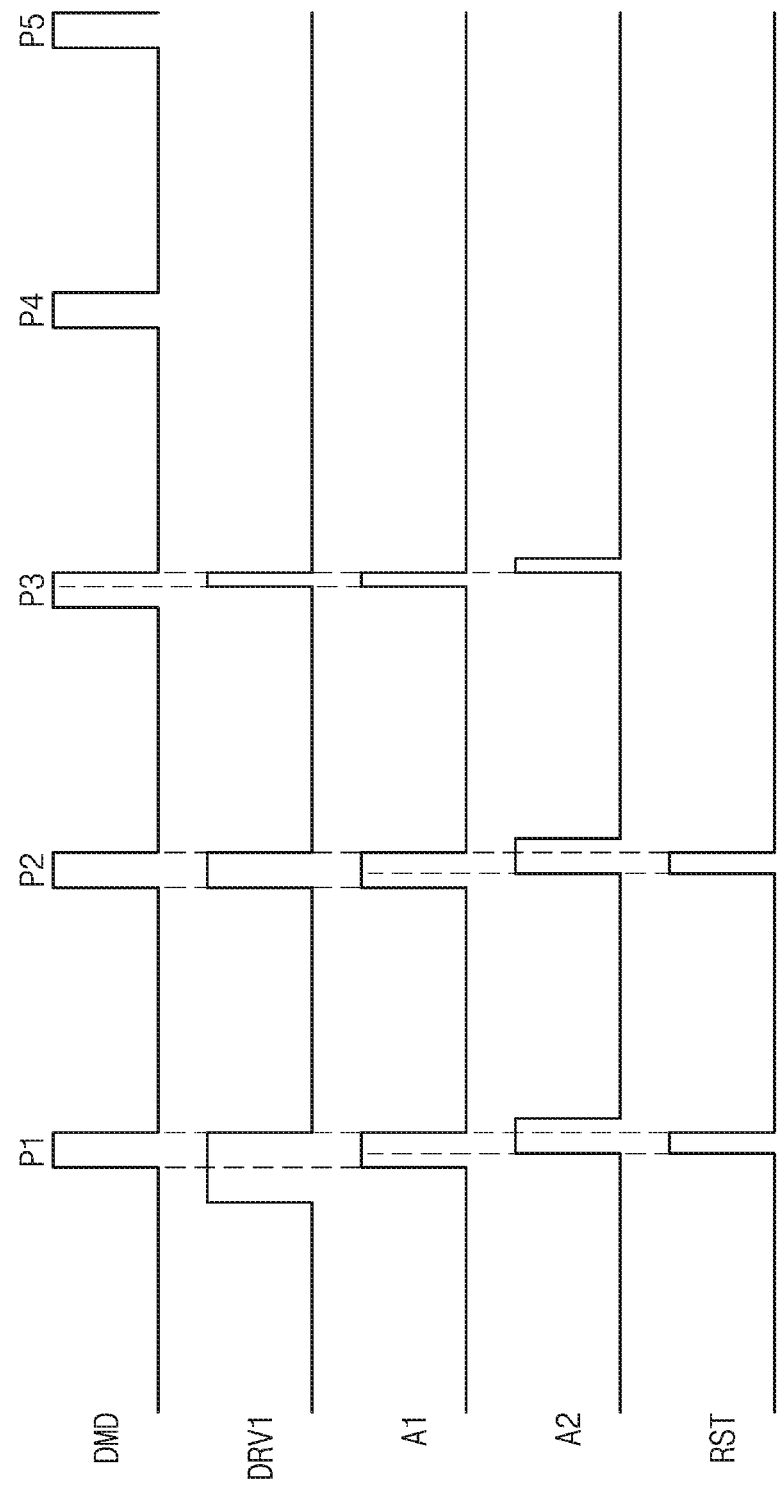
FIG. 7 illustrates an example in which a second block generates a reset signal as a pulse width of a first driving signal changes.

FIG. 7 illustrates an example in which the second block 185b generates the reset signal RST as a pulse width of the first driving signal DRV1 changes. Referring to FIGS. 2, 5, and 7, the first to fifth pulses P1 to P5 are illustrated as the max duty detection pulse DMD. The pulse width of the first driving signal DRV1 may gradually decrease. That is, the pulse width of the second driving signal DRV2 may gradually increase.

For example, the pulse width of the first driving signal DRV1 may gradually decrease with regard to the first to third pulses P1 to P3. A pulse of the first driving signal DRV1 may not be generated with regard to the fourth and fifth pulses P4 and P5. The second driving signal DRV2 may have the max duty with regard to the fourth and fifth pulses P4 and P5.

The internal signal A1 may be generated by performing an AND operation on the max duty detection pulse DMD and the first driving signal DRV1. Accordingly, when the max duty detection pulse DMD and the first driving signal DRV1 all have a high level, the first internal signal A1 has a high level. When at least one of the max duty detection pulse DMD and the first driving signal DRV1 has a low level, the first internal signal A1 has a low level.

The second internal signal A2 may be a signal generated by delaying the first internal signal A1. The reset signal RST is generated by performing an AND operation on the first and second internal signals A1 and A2. Accordingly, when the first and second internal signals A1 and A2 all have a high level, the reset signal RST may have a high level.

With regard to the first and second pulses P1 and P2, the first and second internal signals A1 and A2 have an interval in which high levels thereof overlap with each other. Accordingly, the second block 185b may output (or activate) the reset signal RST with regard to the first and second pulses P1 and P2. That is, with regard to the first and second pulses P1 and P2, the second block 185b may determine that the second driving signal DRV2 does not have the max duty.

The max duty signal DMAX, which is the output of the flip-flop 185d, may be periodically reset in response to the activated reset signal RST. For example, with regard to the first and second pulses P1 and P2, the flip-flop 185d may reset the max duty signal DMAX to a low level.

With regard to the third to fifth pulses P3 to A5, the first and second internal signals A1 and A2 do not have an interval in which high levels thereof overlap with each other. Accordingly, with regard to the third to fifth pulses P3 to P5, the second block 185b may not output (or activate) the reset signal RST. For example, the second block 185b may not determine that the second driving signal DRV2 does not have the max duty.

Figure 8:
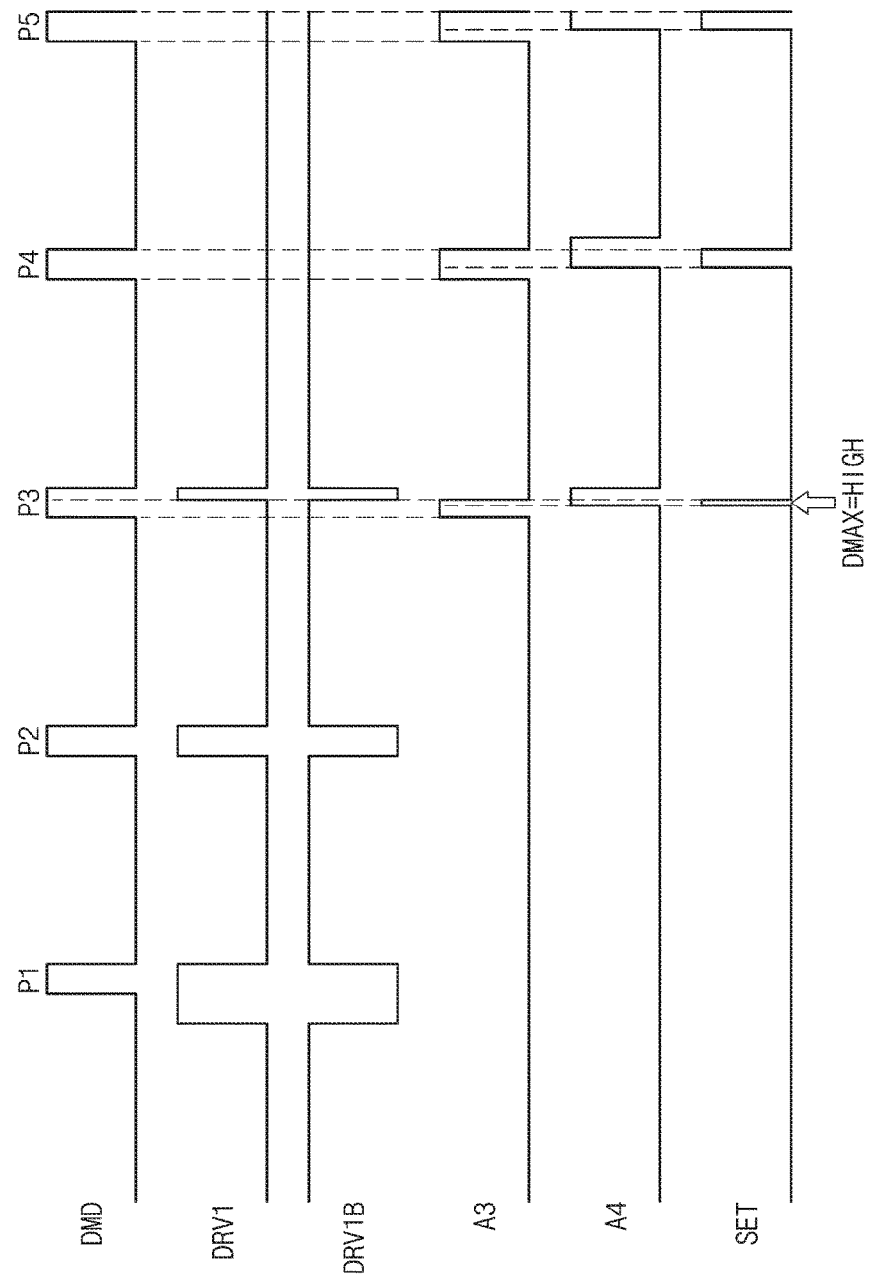
FIG. 8 illustrates an example in which a third block generates a set signal as a pulse width of a first driving signal changes.

FIG. 8 illustrates an example in which the third block 185c generates the set signal SET as a pulse width of the first driving signal DRV1 changes. Referring to FIGS. 2, 5, and 8, the first to fifth pulses P1 to P5 are illustrated as the max duty detection pulse DMD. The pulse width of the first driving signal DRV1 may gradually decrease. That is, the pulse width of the second driving signal DRV2 may gradually increase.

The inverted first driving signal DRV1B may be an inverted waveform of the first driving signal DRV1. The third internal signal A3 may be generated by performing an AND operation on the max duty detection pulse DMD and the inverted first driving signal DRV1B. Accordingly, the third internal signal A3 has high levels in intervals where the max duty detection pulse DMD and the inverted first driving signal DRV1B all have high levels.

The fourth internal signal A4 may be a signal generated by delaying the third internal signal A3. The set signal SET is generated by performing an AND operation on the third and fourth internal signals A3 and A4. Accordingly, the set signal SET may have high levels in intervals where the third and fourth internal signals A3 and A4 all have high levels.

With regard to the first and second pulses P1 and P2, the third internal signal A3 does not have a high level. Accordingly, with regard to the first and second pulses P1 and P2, the third block 185 c may not output (or activate) the set signal SET. With regard to the third to fifth pulses P3 to P5, the third internal signal A3 has high levels.

With regard to the third to fifth pulses P3 to P5, the third and fourth internal signals A3 and A4 have intervals in which high levels thereof overlap with each other. Accordingly, with regard to the third to fifth pulses P3 to P5, the third block 185 c may output (or activate) the set signal SET representing that the second driving signal DRV2 has the max duty.

As the third block 185 c activates the set signal SET, the flip-flop 185d may activate the max duty signal DMAX to a high level. For example, with regard to the third to fifth pulses P3 to P5, the third block 185 c may periodically set the max duty signal DMAX of the flip-flop 185d to a high level.

The inventive concepts are not limited to the case that the max duty detector 185 activates the max duty signal DMAX only when the second driving signal DRV2 completely has the max duty. In some example embodiments, the max duty detector 185 may activate the max duty signal DMAX when the duty ratio of the second driving signal DRV2 is greater than a threshold value. The threshold value may be determined by parameters of the voltage converter 100 that have high levels in intervals where the third and fourth internal signals A3 and A4 overlap with each other.

As described above, if the duty ratio of the second driving signal DRV2 (or a duty ratio of a low level of the first driving signal DRV1) is greater than the threshold value, the max duty detector 185 may activate the max duty signal DMAX to a high level. If the duty ratio of the second driving signal DRV2 is not greater than the threshold value, the max duty detector 185 may deactivate the max duty signal DMAX to a low level. Accordingly, the max duty detector 185 may detect the max duty of the second driving signal DRV2.

Figure 9:
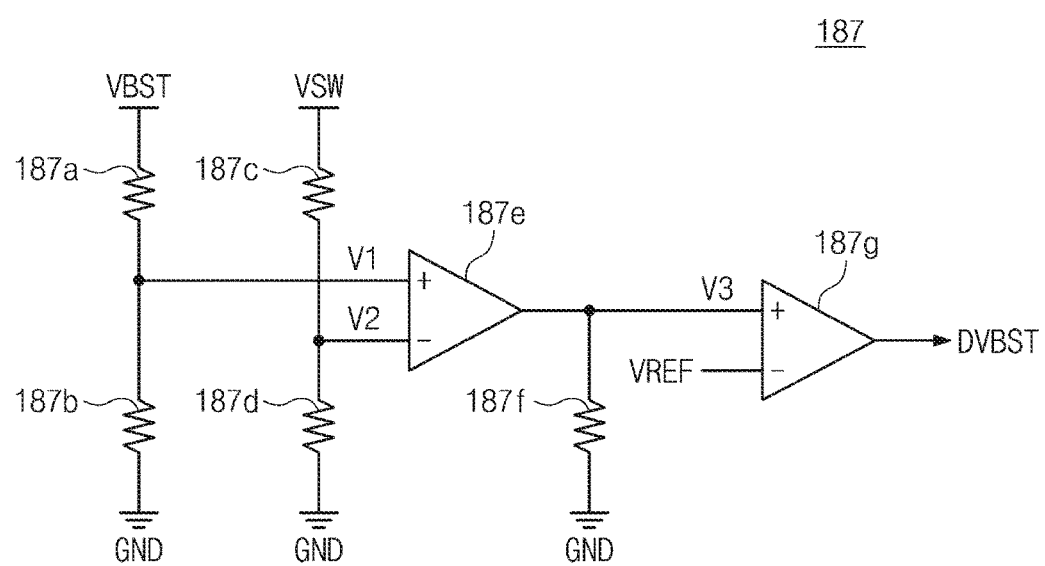
FIG. 9 illustrates an example of a boost voltage detector according to an example embodiment of the inventive concepts.

FIG. 9 illustrates an example of the boost voltage detector 187 according to an example embodiment of the inventive concepts. Referring to FIGS. 5 and 9, the boost voltage detector 187 includes first to fourth resistors 187a to 187d, a first comparator 187e, a fifth resistor 187f, and a second comparator 187g.

The first and second resistors 187a and 187b may divide the boost voltage VBST. A first voltage V1, which is the result obtained by dividing the boost voltage VBST by the first and second resistors 187a and 187b, may be transmitted to a positive input of the first comparator 187e. The third and fourth resistors 187c and 187d may divide the switch voltage VSW. A second voltage V2, which is the result obtained by dividing the switch voltage VSW by the third and fourth resistors 187c and 187d, may be transmitted to a negative input of the first comparator 187e.

In an example embodiment, a division ratio of the first and second resistors 187a and 187b and a division ratio of the third and fourth resistors 187c and 187d may be the same. That is, a difference between the first and second voltages V1 and V2 may be proportional to a difference between the boost voltage VBST and the switch voltage VSW.

The first comparator 187e may compare the first voltage V1 and the second voltage V2. The first comparator 187e may output a third voltage V3 that is proportional to a difference between the first voltage V1 and the second voltage V2. The third voltage V3 may be proportional to a difference between the boost voltage VBST and the switch voltage VSW. The third voltage V3 may be transmitted to a positive input of the second comparator 187g.

The fifth resistor 187f may allow the third voltage V3 to be generated at an output of the first comparator 187e. The second comparator 187g may compare the third voltage V3 and a reference voltage VREF. If the third voltage V3 is greater than the reference voltage VREF, that is, if a difference between the boost voltage VBST and the switch voltage VSW (or a voltage proportional to the difference) is greater than the reference voltage VREF, the second comparator 187g may deactivate the boost voltage signal DVBST (or may make the boost voltage signal DVBST high).

If the third voltage V3 is not greater than the reference voltage VREF, that is, if the difference between the boost voltage VBST and the switch voltage VSW (or the voltage proportional to the difference) is not greater than the reference voltage VREF, the second comparator 187g may activate the boost voltage signal DVBST (or may make the boost voltage signal DVBST low).

If the boost voltage signal DVBST is deactivated (e.g., to a high level), the boost voltage VBST is determined as being sufficiently greater than the switch voltage VSW. For example, the boost voltage VBST is determined to be sufficient if the second gate driver 150 drives the second transistor 130 to be turned on.

If the boost voltage signal DVBST is activated (e.g., to a low level), the boost voltage VBST is determined as being not sufficiently greater than the switch voltage VSW. For example, the boost voltage VBST is determined to be insufficient if the second gate driver 150 fails to drive the second transistor 130 to be turned on.

Figure 10:
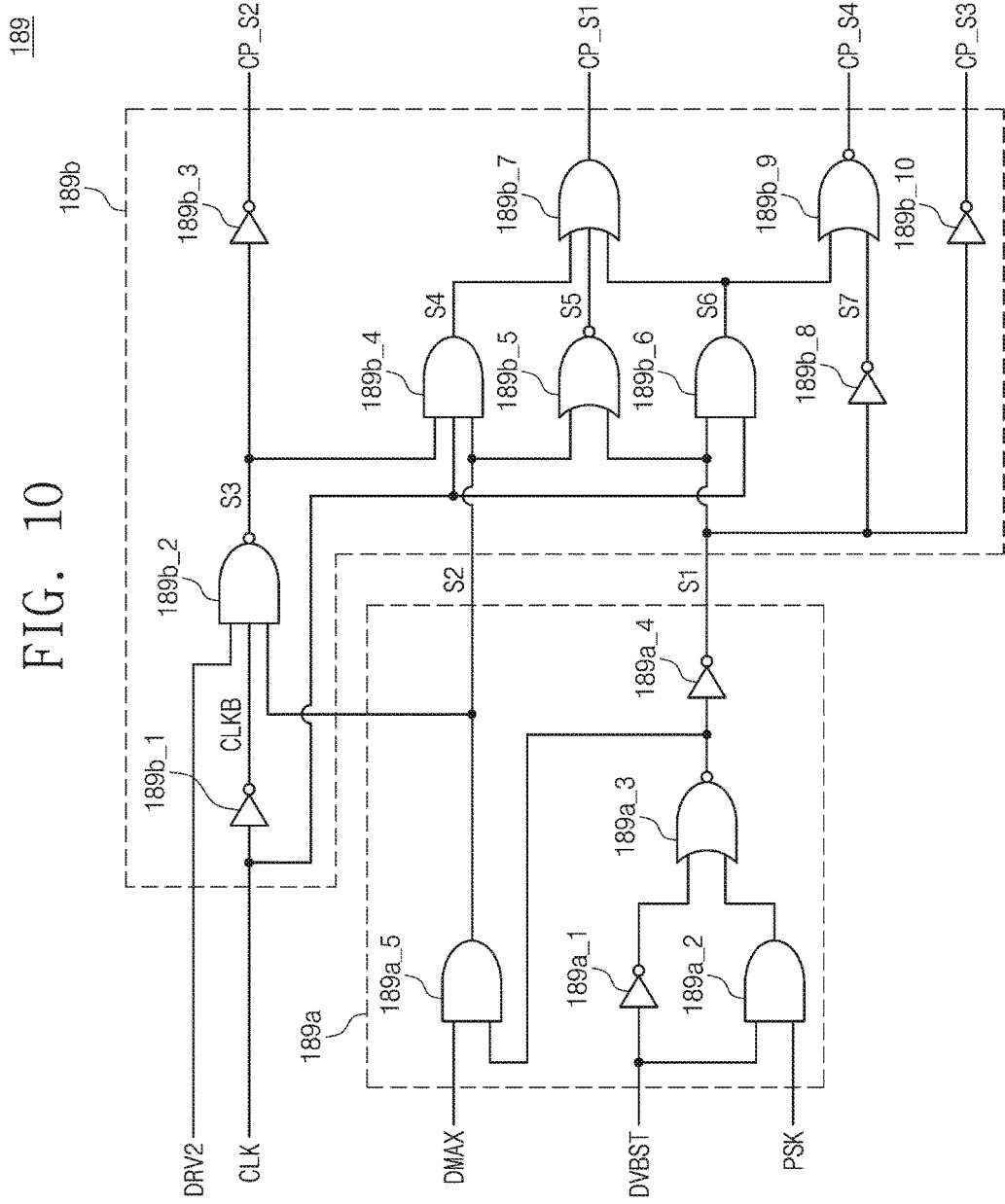
FIG. 10 illustrates an example of a regulation signal generator according to an example embodiment of the inventive concepts.

FIG. 10 illustrates an example of the regulation signal generator 189 according to an example embodiment of the inventive concepts. Referring to FIGS. 2, 5, and 10, the regulation signal generator 189 includes a status determination block 189a and a regulation signal generation block 189b. The status determination block 189a may determine the status of the voltage converter 100 in response to the max duty signal DMAX, the boost voltage signal DVBST, and the pulse skip signal PSK.

The status determination block 189a may control first and second signals S1 and S2 based on the determined status. For example, if a difference between the boost voltage VBST and the switch voltage VSW is less than a reference voltage or if it is determined that the voltage converter 100 exist from the pulse skip mode, and thus, the boost voltage VBST is insufficient, the status determination block 189a may activate the first signal S1 to a high level.

In the case where the boost voltage VBST is sufficient, the status determination block 189a may deactivate the first signal S1 to a low level. If the boost voltage VBST is sufficient, but that the second driving signal DRV2 is determined to have the max duty (refer to operation S130 of FIG. 3), the status determination block 189a may activate the second signal S2 to a high level.

The status determination block 189a includes a first status determination inverter 189a_1, a first status determination AND element 189a_2, a status determination NOR element 189a_3, a second status determination inverter 189a_4, and a second status determination AND element 189a_5. The first status determination inverter 189a_1 may invert and output the boost voltage signal DVBST.

The first status determination AND element 189a_2 may output a logical product of the boost voltage signal DVBST and the pulse skip signal PSK. The status determination NOR element 189a_3 may output logical NOR of an output of the first status determination inverter 189a_1 and an output of the first status determination AND element 189a_2.

The second status determination inverter 189a_4 may invert the output of the status determination NOR element 189a_3 to output the first signal S1. The second status determination AND element 189a_5 may output a logical product of the max duty signal DMAX and the output of the status determination NOR element 189a_3 to output the second signal S2.

If the boost voltage signal DVBST has a low level (e.g., the boost voltage VBST is not sufficiently high) or the pulse skip signal PSK has a high level (e.g., if the voltage converter 100 exits from the pulse skip mode), the status determination block 189a may determine that the boost voltage VBST is insufficient (refer to operation S110 of FIG. 3). The first signal S1 may have values of Table 1 depending on the boost voltage signal DVBST and the pulse skip signal PSK.

TABLE 1

| Boost voltage signal (DVBST) | Pulse skip signal (PSK) | First signal (S1) |
|---|---|---|
| 1 (sufficient) | 1 (pulse skip mode) | 1 (activation) |
| 1 (sufficient) | 0 | 0 (deactivation) |
| 0 (insufficient) | 1 (pulse skip mode) | 1 (activation) |

TABLE 1-continued

| Boost voltage signal (DVBST) | Pulse skip signal (PSK) | First signal (S1) |
|---|---|---|
| 0 (insufficient) | 0 | 1 (activation) |

If the boost voltage VBST is sufficient, but the second driving signal DRV2 has the max duty, the status determination block 189a may activate the second signal S2. The second signal S2 may have values of Table 2 depending on the first signal S1 and the max duty signal DMAX.

TABLE 2

| First signal (S1) | Max duty signal (DMAX) | Second signal (S2) |
|---|---|---|
| 0 (deactivation) | 1 (max duty) | 1 |
| 0 (deactivation) | 0 | 0 |
| 1 (activation) | 1 (max duty) | 0 |
| 1 (activation) | 0 | 0 |

The regulation signal generation block 189b may control the first to fourth control signals $CP_{13}$ S1 to $CP_{13}$ S4 in response to the first and second signals S1 and S2, the clock signal CLK, and the second driving signal DRV2. The regulation signal generation block 189b includes a first regulation inverter 189b_1, a regulation NAND element 189b_2, a second regulation inverter 189b_3, a first regulation AND element 189b_4, a regulation NOR element 189b_5, a second regulation AND element 189b_6, a regulation OR element 189b_7, a third regulation inverter 189b_8, a regulation NOR element 189b_9, and a fourth regulation inverter 189b_10.

The first regulation inverter 189b_1 may invert the clock signal CLK to output the inverted clock signal CLKB. The regulation NAND element 189b_2 may output the result of performing a NAND operation on the second driving signal DRV2, the inverted clock signal CLKB, and the second signal S2 as a third signal S3.

The second regulation inverter 189b_3 may invert the third signal S3 to output the second control signal CP_S2. The first regulation AND element 189b_4 may output the result of performing an AND operation on the third signal S3, the clock signal CLK, and the second signal S2 as a fourth signal S4. The regulation NOR element 189b_5 may output the result of performing a NOR operation on the second signal S2 and the first signal S1 as a fifth signal S5.

The second regulation AND element 189b_6 may output the result of performing an AND operation on the first signal S1 and the clock signal CLK as a sixth signal S6. The regulation OR element 189b_7 may output the result of performing an OR operation on the fourth signal S4, the fifth signal S5, and the sixth signal S6 as the first control signal CP_S1.

The third regulation inverter 189b_8 may invert the first signal S1 to output a seventh signal S7. The regulation NOR element 189b_9 may output the result of performing a NOR operation on the seventh signal S7 and the sixth signal S6 as the fourth control signal CP_S4. The fourth regulation inverter 189b_10 may invert the first signal S1 to output the third control signal CP_S3. The first to fourth control signals CP_S1 to CP_S4 may be transmitted to the regulator 190.

Figure 11:
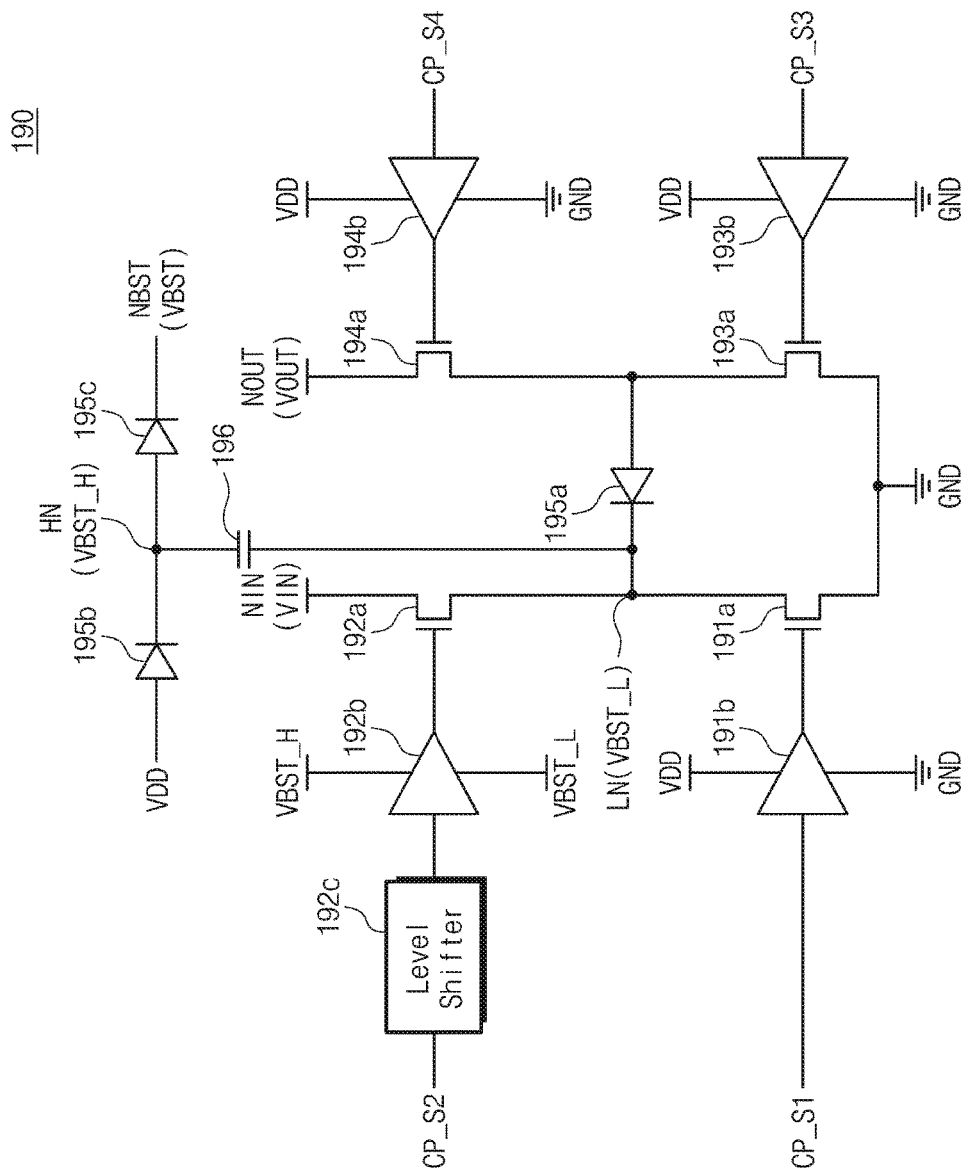
FIG. 11 illustrates an example of a regulator according to an example embodiment of the inventive concepts.

FIG. 11 illustrates an example of the regulator 190 according to an example embodiment of the inventive concepts. Referring to FIGS. 2 and 11, the regulator 190 includes first to fourth transistors 191a to 194a, first to fourth drivers 191b to 194b, a level shifter 192c, first to third diodes 195a to 195c, and a capacitor 196.

The first and second transistors 191a and 192a are connected in series between the ground node GND and the input node NIN. A node between the first and second transistors 191a and 192a may be a low node LN. A gate voltage of the first transistor 191a is controlled by the first driver 191b. A gate voltage of the second transistor 192a is controlled by the second driver 192b.

The third and fourth transistors 193a and 194a are connected in series between the ground node GND and the output node NOUT. A gate voltage of the third transistor 193a is controlled by the third driver 193b. A gate voltage of the fourth transistor 194a is controlled by the fourth driver 194b.

A cathode of the first diode 195a is connected to the low node LN. An anode of the first diode 195a is connected to a node between the third and fourth transistors 193a and 194a. The second and third diodes 195b and 195c are connected in series between a power node, to which the power supply voltage VDD is supplied, and the boost node NBST. A node between the second and third diodes 195b and 195c may be a high node HN.

The first driver 191b is biased by the power supply voltage VDD and the ground voltage of the ground node GND. The first driver 191b may operate in response to the first control signal CP_S1. The second driver 192b is biased by a high boost voltage VBST_H of the high node HN and a low boost voltage VBST_L of the low node LN.

The second driver 192b may be controlled according to a signal that is generated by translating a level of the second control signal CP_S2 at the level shifter 192c. For example, the level shifter 192c may translate (e.g., increase) a level of the second control signal CP_S2 to a level defined by the high boost voltage VBST_H and the low boost voltage VBST_L.

The third driver 193b is biased by the power supply voltage VDD and the ground voltage. The third driver 193b may be controlled by the third control signal CP_S3. The fourth driver 194b is biased by the power supply voltage VDD and the ground voltage. The fourth driver 194b is controlled by the fourth control signal CP_S4. The capacitor 196 is connected between the high node HN and the low node LN.

Figure 12:
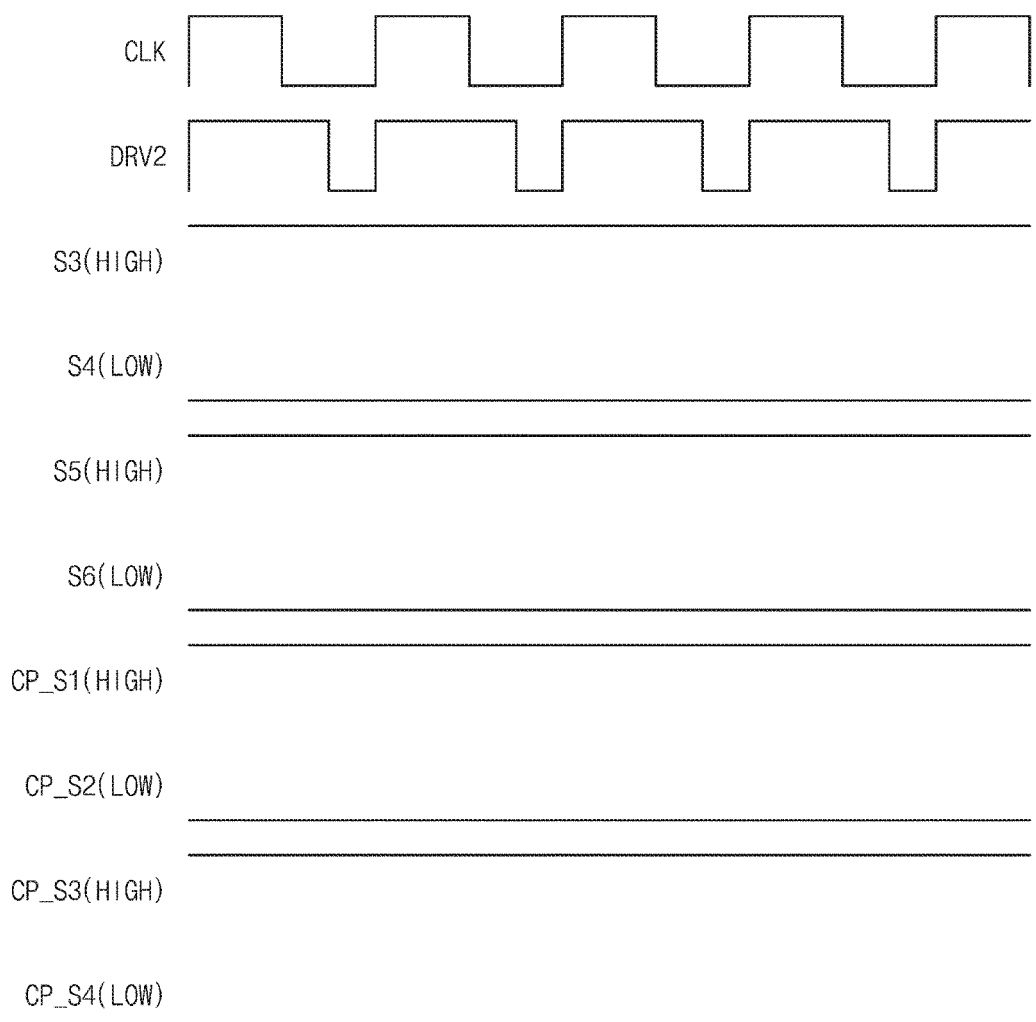
FIG. 12 illustrates an example of signals associated with a regulation signal generation block when a first signal and a second signal are deactivated.

FIG. 12 illustrates an example of signals associated with the regulation signal generation block 189b when the first signal S1 and the second signal S2 are deactivated. That is, FIG. 12 illustrates signals when the voltage converter 100 is at a normal state. In other words, FIG. 12 illustrates signals when a difference between the boost voltage and the switch voltage is not less than a reference voltage, when the voltage converter does not exit from a pulse skip mode, and when a duty ratio of the gate voltage of the second transistor is not greater than a threshold value. Referring to FIGS. 2, 10, and 12, the clock signal CLK and the second driving signal DRV2 are illustrated.

The third signal S3 has a low level when the second signal S2 is at a high level (e.g., is activated), the clock signal CLK is at a low level, and the second driving signal DRV2 is at a high level. Because FIG. 12 assumes that the second signal S2 is at a low level (e.g., is deactivated), the third signal S3 is fixed to a high level.

The fourth signal S4 has a high level when the third signal S3, the clock signal CLK, and the second signal S2 all are at a high level. Because FIG. 12 assumes that the second signal S2 is at a low level (e.g., is deactivated), the fourth signal S4 is fixed to a low level. The fifth signal S5 has a high level when both the first and second signals S1 and S2 are at a low level. Because FIG. 12 assumes that both the first signal S1 and the second signal S2 are at a low level, the fifth signal S5 is fixed to a high level.

The sixth signal S6 has a high level when both the first signal S1 and the clock signal CLK are at a high level. Because FIG. 12 assumes that the first signal S1 is at a low level, the sixth signal S6 is fixed to a low level. The first control signal CP_S1 has a low level only when all the fourth to sixth signals S4 to S6 are at a low level. Because FIG. 12 assumes that the fifth signal S5 is at a high level, the first control signal CP_S1 is fixed to a high level.

The second control signal CP_S2 may be an inverted version of the third signal S3. Because the third signal S3 is at a high level, the second control signal CP_S2 is fixed to a low level. The third control signal CP_S3 may be an inverted version of the first signal S1. Because FIG. 12 assumes that the first signal S1 is at a low level, the third control signal CP_S3 is fixed to a high level.

The fourth control signal CP_S4 has a high level only when both the sixth and seventh signals S6 and S7 are at a low level. The sixth signal S6 may be an inverted version of the first signal S1. Accordingly, the fourth control signal CP_S4 has a high level only when the first signal S1 is at a high level and the sixth signal S6 is at a low level. Because the first signal S1 has a low level, the fourth control signal CP_S4 is fixed to a low level.

Figure 13:
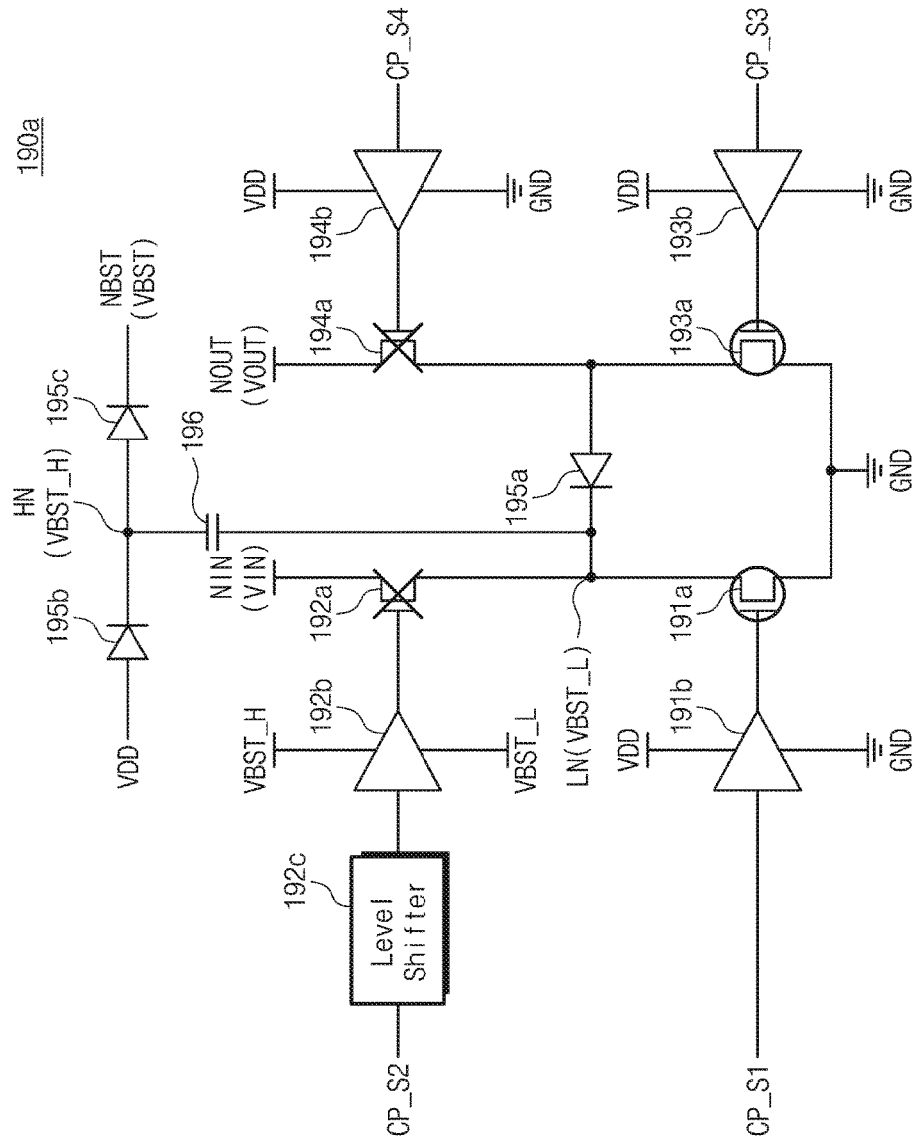
FIG. 13 illustrates how the regulator is controlled by signals of FIG. 12.

FIG. 13 illustrates how the regulator 190 is controlled by signals of FIG. 12. Referring to FIGS. 2, 12, and 13, because the second and fourth control signals CP_S2 and CP_S4 are fixed to a low level, the second and fourth transistors 192a and 194a maintain a turn-off state. Because the first and third control signals CP_S1 and CPS_3 are fixed to a high level, the first and third transistors 191a and 193a maintain a turn-on state.

A voltage of the low node LN is a ground voltage. The power supply voltage VDD is supplied to the boost node NBST through the second and third diodes 195b and 195c. While the first transistor 120 is turned on, the boost capacitor CBST is charged by the power supply voltage VDD output from the regulator 190.

At timing when the first transistor 120 is turned off and the second transistor 130 is turned on, the boost voltage VBST may be greater than the switch voltage VSW by a voltage (e.g., the power supply voltage VDD) charged in the boost capacitor CBST. Accordingly, the second gate driver 150 may turn on the second transistor 130 based on the boost voltage VBST.

Figure 14:
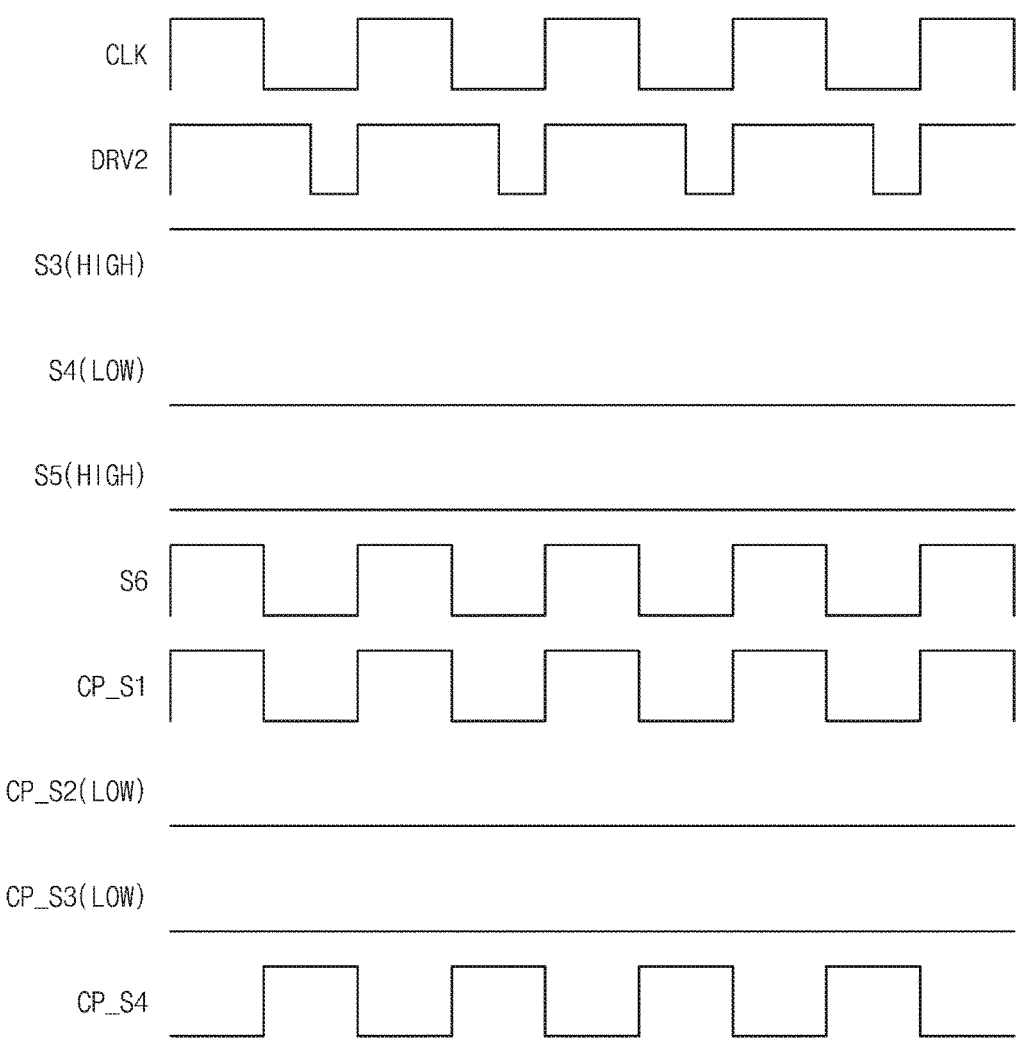
FIG. 14 illustrates an example of signals associated with the regulation signal generation block when a first signal is activated and a second signal are deactivated.

FIG. 14 illustrates an example of signals associated with the regulation signal generation block 189b when the first signal S1 is activated and the second signal S2 are deactivated. That is, FIG. 14 illustrates signals that are controlled to the output voltage pumping mode due to the insufficiency of the boost voltage VBST in the voltage converter 100. Referring to FIGS. 2, 10, and 14, the clock signal CLK and the second driving signal DRV2 are illustrated.

The third signal S3 has a low level when the second signal S2 is at a high level (e.g., is activated), the clock signal CLK is at a low level, and the second driving signal DRV2 is at a high level. Because FIG. 14 assumes that the second signal S2 is at a low level (e.g., is deactivated), the third signal S3 is fixed to a high level.

The fourth signal S4 has a high level when the third signal S3, the clock signal CLK, and the second signal S2 all are at a high level. Because FIG. 14 assumes that the second signal S2 is at a low level (e.g., is deactivated), the fourth signal S4 is fixed to a low level. The fifth signal S5 has a high level when both the first signal S1 and the second signal S2 are at a low level. Because FIG. 14 assumes that the first signal S1 is at a high level, the fifth signal S5 is fixed to a low level.

The sixth signal S6 has a high level when both the first signal S1 and the clock signal CLK are at a high level. Because FIG. 14 assumes that the first signal S1 is at a high level, the sixth signal S6 may have the same waveform as the clock signal CLK. The first control signal CP_S1 has a low level only when all the fourth to sixth signals S4 to S6 are at a low level. In FIG. 14, because the fourth and fifth signals S4 and S5 are fixed to a low level, the first control signal CP_S1 has the same waveform as the sixth signal S6.

The second control signal CP_S2 may be an inverted version of the third signal S3. In FIG. 14, because the third signal S3 is at a high level, the second control signal CP_S2 is fixed to a low level. The third control signal CP_S3 may be an inverted version of the first signal S1. Because FIG. 14 assumes that the first signal S1 is at a high level, the third control signal CP_S3 is fixed to a low level.

The fourth control signal CP_S4 has a high level only when the first signal S1 is at a high level and the sixth signal S6 is at a low level. Because FIG. 14 assumes that the first signal S1 is at a high level and the sixth signal S6 switches between a high level and a low level, the fourth control signal CP_S4 has an inverted waveform of the sixth signal S6. The fourth control signal CP_S4 may be complementary to the first control signal CP_S1.

Figure 15:
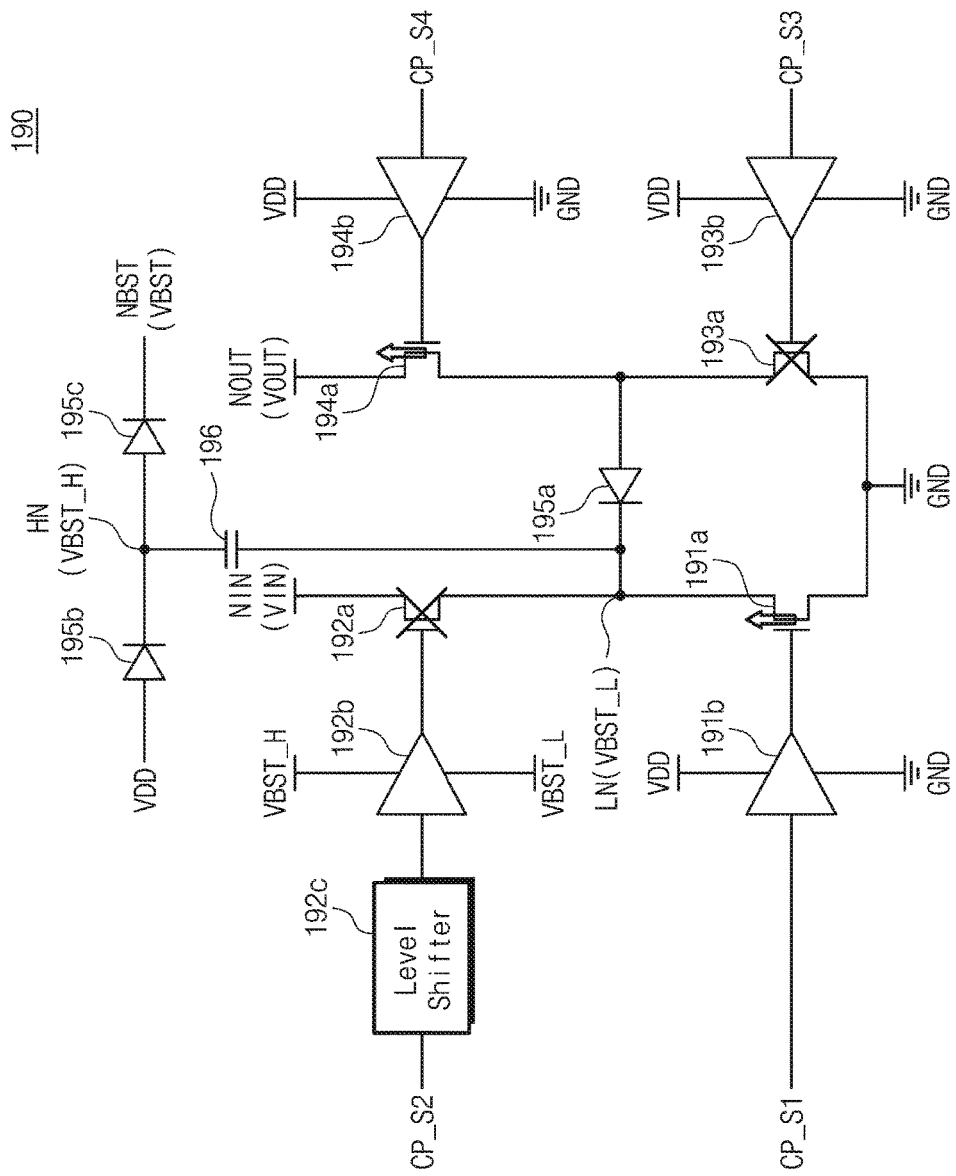
FIG. 15 illustrates how the regulator is controlled by signals of FIG. 14.

FIG. 15 illustrates how the regulator 190 is controlled by signals of FIG. 14. Referring to FIGS. 2, 14, and 15, because the second and third control signals CP_S2 and CP_S3 are fixed to a low level, the second and third transistors 192a and 193a maintain a turn-off state. As illustrated by an arrow, each of the first and fourth control signals CP_S1 and CP_S4 may switch between a high level and a low level and may transmit a voltage pumped from the output voltage VOUT to the boost node NBST.

When the first transistor 191a is turned on and the fourth transistor 194a is turned off, the capacitor 196 is charged with the power supply voltage VDD transmitted through the second diode 195b. When the first transistor 191a is turned off and the fourth transistor 194a is turned on, a voltage of the high node HN increases to a voltage corresponding to a sum of the output voltage VOUT and a voltage (e.g., the power supply voltage VDD) charged in the capacitor 196. That is, a voltage pumped from the output voltage VOUT by an amount as much as the power supply voltage VDD is transmitted to the boost node NBST.

Figure 16:
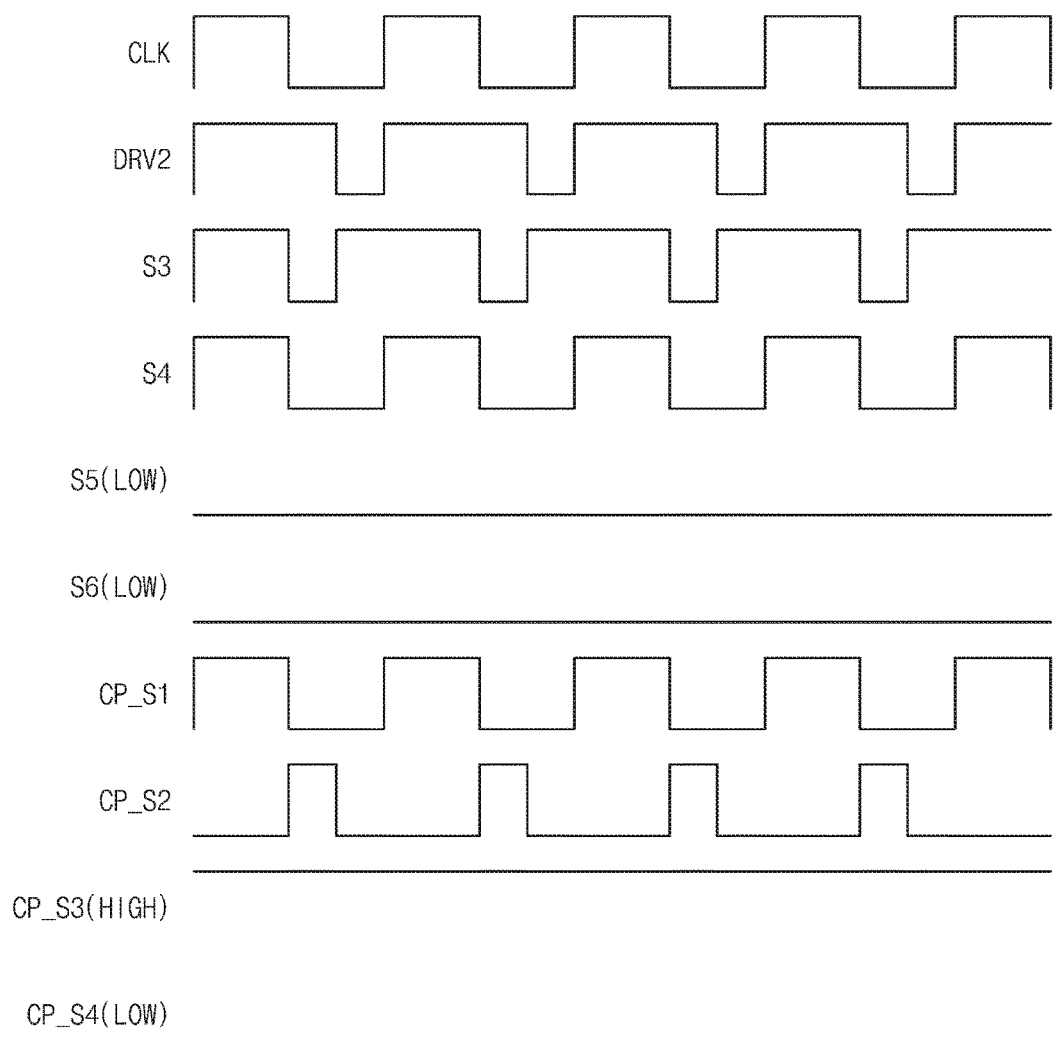
FIG. 16 illustrates an example of signals associated with the regulation signal generation block when a first signal is deactivated and a second signal are activated.

FIG. 16 illustrates an example of signals associated with the regulation signal generation block 189b when the first signal S1 is deactivated and the second signal S2 are activated. That is, FIG. 16 illustrates signals that are controlled to the input voltage pumping mode when the max duty occurs in the voltage converter 100. Referring to FIGS. 2, 10, and 16, the clock signal CLK and the second driving signal DRV2 are illustrated.

The third signal S3 has a low level when the second signal S2 is at a high level (e.g., is activated), the clock signal CLK is at a low level, and the second driving signal DRV2 is at a high level. Because FIG. 16 assumes that the second signal S2 is at a high level (e.g., is activated), the third signal S3 has low levels in intervals where the clock signal CLK is at a low level and the second driving signal DRV2 is at a high level. In the remaining intervals, the third signal S3 has a high level.

The fourth signal S4 has a high level when the third signal S3, the clock signal CLK, and the second signal S2 all are at a high level. Because FIG. 16 assumes that the second signal S2 is at a high level (e.g., is activated), the fourth signal S4 has high levels in intervals where the third signal S3 and the clock signal CLK are at a high level. In the remaining intervals, the fourth signal S4 has low levels.

The fifth signal S5 has a high level when the first and second signals S1 and S2 all are at a low level. Because FIG. 16 assumes that the second signal S2 is at a high level, the fifth signal S5 is fixed to a low level. The sixth signal S6 has a high level when the first signal S1 and the clock signal CLK all are at a high level. Because FIG. 16 assumes that the first signal S1 is at a low level, the sixth signal S6 is fixed to a low level.

The first control signal CP_S1 has a low level only when the fourth to sixth signals S4 to S6 all are at a low level. Because FIG. 16 assumes that the fifth and sixth signals S5 and S6 are fixed to a low level, the first control signal CP_S1 has the same waveform as the fourth signal S4. The second control signal CP_S2 may be an inverted version of the third signal S3.

The third control signal CP_S3 may be an inverted version of the first signal S1. Because FIG. 16 assumes that the first signal S1 is at a low level, the third control signal CP_S3 is fixed to a high level. The fourth control signal CP_S4 has a high level only when the first signal S1 is at a high level and the sixth signal S6 is at a low level. Because FIG. 16 assumes that the first signal S1 is at a low level, the fourth control signal CP_S4 is fixed to a low level.

The first and second control signals CP_S1 and CP_S2 may be complementary in intervals where the second driving signal DRV2 is at a high level. For example, in intervals where the second driving signal DRV2 is at a high level, if the first control signal CP_S1 is at a high level, the second control signal CP_S2 may be at a low level.

In intervals where the second driving signal DRV2 is at a high level, if the first control signal CP_S1 is at a low level, the second control signal CP_S2 may be at a high level. The first and second control signals CP_S1 and CP_S2 may have low levels in intervals where the second driving signal DRV2 is at a low level.

Figure 17:
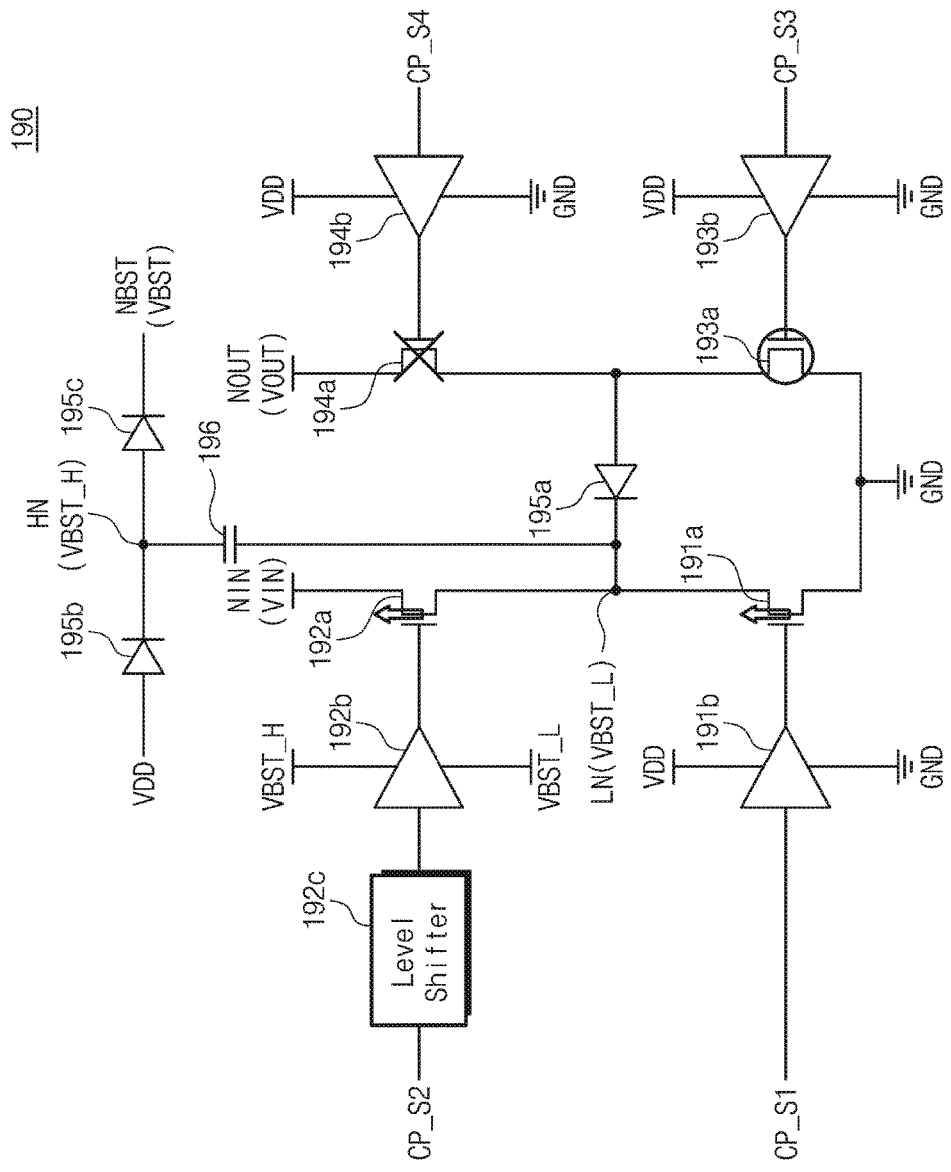
FIG. 17 illustrates how the regulator is controlled by signals of FIG. 16.

FIG. 17 illustrates how the regulator 190 is controlled by signals of FIG. 16. Referring to FIGS. 2, 16, and 17, since the fourth control signal CP_S4 is fixed to a low level, the fourth transistor 194a maintains a turn-off state. Because the third control signal CP_S3 is fixed to a high level, the third transistor 193a maintains a turn-on state.

As illustrated by an arrow, each of the first and second control signals CP_S1 and CP_S2 may switch between a high level and a low level in intervals where the second driving signal DRV2 is at a high level and may transmit a voltage pumped from the input voltage VIN to the boost node NBST. When the first transistor 191a is turned on and the second transistor 192a is turned off, the capacitor 196 is charged with the power supply voltage VDD transmitted through the second diode 195b.

When the first transistor 191a is turned off and the second transistor 192a is turned on, a voltage of the high node HN increases to a voltage corresponding to a sum of a voltage of the high node HN and a voltage (e.g., the power supply voltage VDD) charged in the capacitor 196. That is, a voltage pumped from the input voltage VIN by an amount as much as the power supply voltage VDD is transmitted to the boost node NBST.

Figure 18:
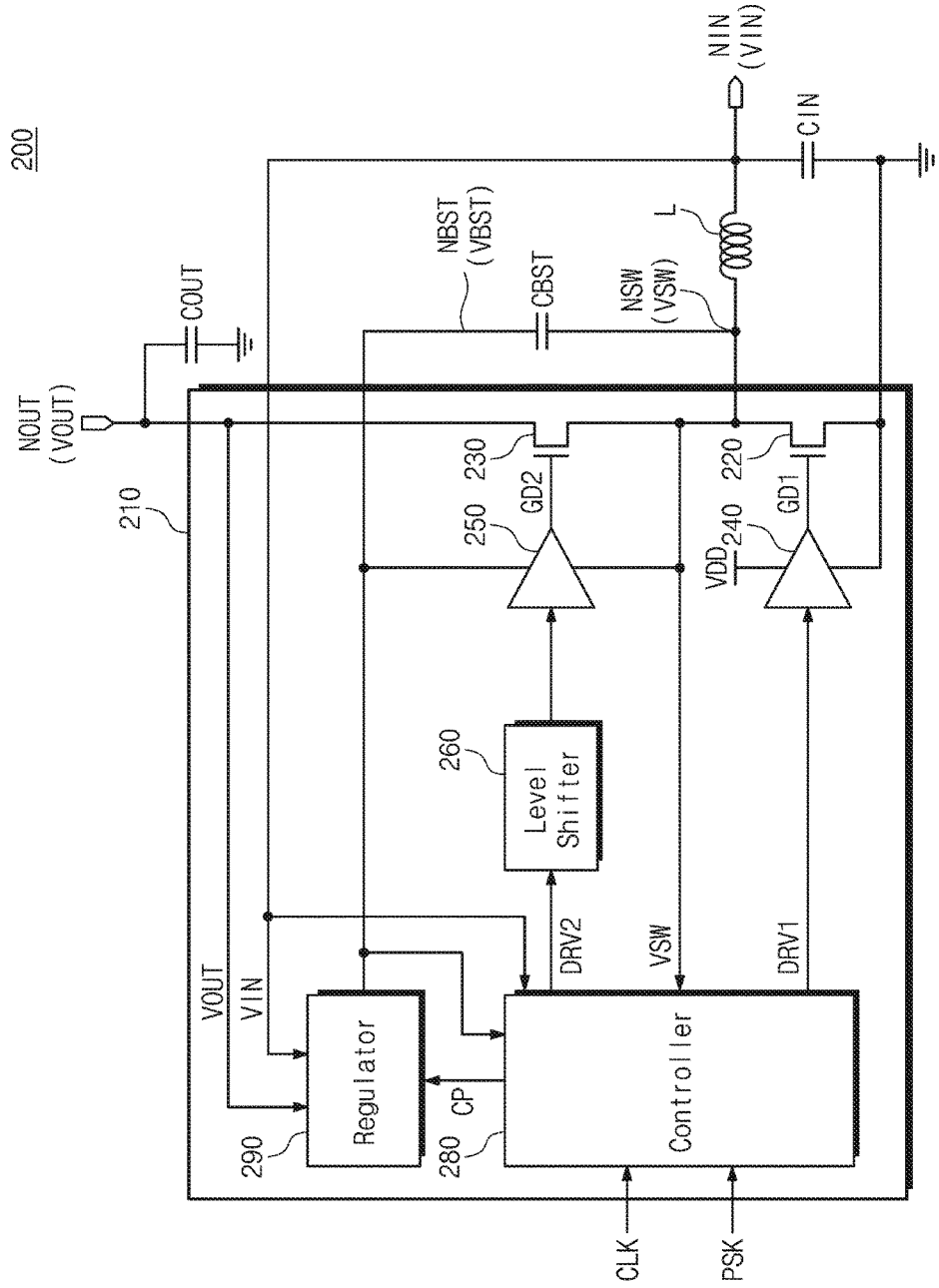
FIG. 18 illustrates a voltage converter according to an example embodiment of the inventive concepts.

FIG. 18 illustrates a voltage converter 200 according to an example embodiment of the inventive concepts. Referring to FIG. 18, the voltage converter 200 includes first and second transistors 220 and 230, first and second gate drivers 240 and 250, a level shifter 260, a controller 280, a regulator 290, an inductor "L", an input capacitor CIN, an output capacitor COUT, and a boost capacitor CBST.

The voltage converter 200 may convert an input voltage VIN of an input node NIN to an output voltage VOUT of an output node NOUT. For example, the voltage converter 200 may be a boost converter that steps up a level of the input voltage VIN to output the output voltage VOUT.

The first and second transistors 220 and 230 may be connected in series between a ground node GND supplied with a ground voltage and the output node NOUT. A node between the first and second input transistors 120 and 130 may be a switch node NSW. The inductor "L" is connected between the switch node NSW and the input node NIN. The input capacitor CIN is connected between the input node NIN and the ground node GND.

The boost capacitor CBST is connected between the switch node NSW and the boost node NBST. The output capacitor COUT is connected between the output node NOUT and the ground node GND. The first and second transistors 220 and 230, the first and second gate drivers 240 and 250, the level shifter 260, the controller 280, and the regulator 290 are the same as described with reference to FIG. 2, and thus, a description thereof will not be repeated here.

The voltage converter 200 may enter the input voltage pumping mode when the boost voltage VBST is insufficient. The voltage converter 200 may enter the output voltage pumping mode when the second driving signal DRV2 has the max duty. The regulator 290 may have the same structure of FIG. 11 except that the input node NIN and the output node NOUT are exchanged. The controller 280 may have the same structure as described with reference to FIGS. 4 to 10.

According to an example embodiment of the inventive concepts, the voltage converter 100 or 200 in which switching transistors may be implemented with NMOS transistors. Because PMOS transistors are not used, the size of the voltage converter 100 or 200 may be reduced. By configuring the regulator 190 or 290 to operate in at least three modes including the normal mode, the output voltage pumping mode, and the input voltage pumping mode, the second transistor 130 or 230 can be securely turned on at all times. Accordingly, the voltage converter 100 or 200 with improved reliability can be implemented.

In the above-described example embodiments, components according to example embodiments of the inventive concepts are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

According to the inventive concepts, a voltage converter adjusts a gate voltage of a switching transistor such that the switching transistor is turned on according to a change in environment. Accordingly, the voltage converter with improved reliability and/or an operating method thereof may be provided.

While the inventive concepts have been described with reference to example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A voltage converter comprising:
   an inductor connected between an output node and a switch node;
   a capacitor connected between the output node and a ground node;
   a first transistor connected between the switch node and the ground node;
   a second transistor connected between the switch node and an input node;
   a boost capacitor connected between the switch node and a boost node;
   a first driver configured to drive a gate voltage of the first transistor based on a ground voltage of the ground node and a power supply voltage of a power node;
   a second driver configured to drive a gate voltage of the second transistor based on a switch voltage of the switch node and a boost voltage of the boost node and; and
   a regulator configured to control the boost voltage by selecting one of two or more modes depending on a status of the voltage converter, the two or more modes including a first mode of pumping from an input voltage of the input node to generate the boost voltage, a second mode of pumping from an output voltage of the output node to generate the boost voltage, and a third mode of outputting of the power supply voltage as the boost voltage.

2. The voltage converter of claim 1, wherein the regulator is further configured to pump an output voltage of the output node to generate the boost voltage if a difference between the boost voltage and the switch voltage is less than a reference voltage.

3. The voltage converter of claim 1, wherein the regulator is further configured to pump an output voltage of the output node to generate the boost voltage if the voltage converter exits from a pulse skip mode.

4. The voltage converter of claim 1, wherein the regulator is further configured to pump an input voltage of the input node to generate the boost voltage if a duty ratio of the gate voltage of the second transistor is greater than a threshold value.

5. The voltage converter of claim 4, wherein the regulator is further configured to pump while the gate voltage of the second transistor is at a high level.

6. The voltage converter of claim 1, wherein the regulator is further configured to charge the boost capacitor with the power supply voltage of the power node while the first transistor is turned on if a difference between the boost voltage and the switch voltage is not less than a reference voltage, the voltage converter does not exit from a pulse skip mode, and a duty ratio of the gate voltage of the second transistor is not greater than a threshold value.

7. The voltage converter of claim 1, wherein the regulator is further configured to maintain the boost voltage of the boost node to be greater than the switch voltage of the switch node.

8. The voltage converter of claim 1, further comprising:
   a gate drive signal generator configured to output a first driving signal to the first driver and output a second driving signal to the second driver;
   a max duty detector configured to output a max duty signal based on a clock signal and the first driving signal if a duty ratio of the gate voltage of the second transistor is greater than a threshold value;
   a boost voltage detector configured to output a boost voltage signal based one the boost voltage and the switch voltage if a difference between the boost voltage and the switch voltage is less than a reference voltage; and
   a regulation signal generator configured to output first to fourth control signals to the regulator based on the max duty signal, the boost voltage signal, the clock signal, the second driving signal, and a pulse skip signal.

9. The voltage converter of claim 8, wherein the max duty detector includes:
   a first block configured to output a logical product of a delayed signal of the clock signal and an inverted signal of the clock signal as a max duty detection pulse;
   a second block configured to produce a logical product of the max duty detection pulse and the first driving signal as a first signal and output a logical product of the first signal and a delayed signal of the first signal as a reset signal;
   a third block configured to produce a logical product of an inverted signal of the first driving signal and the max duty detection pulse as a second signal and output a logical product of the second signal and a delayed signal of the second signal as a set signal; and
   a flip-flop configured to output the max duty signal based on the reset signal and the set signal.

10. The voltage converter of claim 8, wherein the max duty detector is configured to check a duty ratio of the first driving signal periodically and activate the max duty signal if the duty ratio of the first driving signal is greater than the threshold value.

11. The voltage converter of claim 8, wherein the boost voltage detector includes:
    first and second resistors configured to output a first voltage by dividing the boost voltage;
    third and fourth resistors configured to output a second voltage by dividing the switch voltage;
    a first comparator configured to output a difference between the first voltage and the second voltage as a third voltage; and
    a second comparator configured to output a difference between the third voltage and a reference voltage as the boost voltage signal.

12. The voltage converter of claim 8, wherein the regulation signal generator includes a status determination block configured to:
    deactivate a first status signal if the boost voltage signal and the pulse skip signal are deactivated, and otherwise activate the first status signal; and
    activate a second status signal if the first status signal is deactivated and the max duty signal is activated, and otherwise inactivate the second status signal.

13. The voltage converter of claim 12, wherein the regulation signal generator further includes a drive block configured to:
    control the first to fourth control signals such that the regulator charges the power supply voltage in the boost capacitor while the second driving signal is at a high level if the first and second status signals are deactivated.

14. The voltage converter of claim 13, wherein the drive block is further configured to control the first to fourth control signals such that the regulator pumps an output voltage of the output node to generate the boost voltage if the first status signal is activated and the second status signal is deactivated.

15. The voltage converter of claim 13, wherein the drive block is further configured to control the first to fourth control signals such that the regulator pumps an input voltage of the input node to generate the boost voltage if the first status signal is deactivated and the second status signal is activated.

16. A voltage converter comprising:
    an inductor connected between an input node and a switch node;
    a first capacitor connected between the input node and a ground node;
    a first transistor connected between the switch node and the ground node;
    a second transistor connected between the switch node and an output node;
    a boost capacitor connected between the switch node and a boost node;
    a second capacitor connected between the output node and the ground node;
    a first driver configured to drive a gate voltage of the first transistor;
    a second driver configured to drive a gate voltage of the second transistor depending on a boost voltage of the boost node and a switch voltage of the switch node; and
    a regulator configured to control the boost voltage by selecting one of two or more modes depending on a status of the voltage converter, the two or more modes including a first mode of pumping from an input voltage of the input node to generate the boost voltage, a second mode of pumping from an output voltage of the output node to generate the boost voltage, and a third mode of outputting of a power supply voltage as the boost voltage.

17. The voltage converter of claim 16, wherein the status of the voltage converter includes a first state where the boost voltage is not higher, by an amount of a reference value, than the switch voltage, a second state where the voltage converter exits from a pulse skip mode, and a third state where a duty ratio of the gate voltage of the second transistor is greater than a threshold value.

* * * * *